United States Patent
Uehara

(10) Patent No.: US 7,279,669 B2
(45) Date of Patent: Oct. 9, 2007

(54) METHOD FOR DETECTING PHOTOELECTRIC CONVERSION AMOUNT AND PHOTOELECTRIC CONVERTER, METHOD FOR INPUTTING IMAGE AND DEVICE FOR INPUTTING IMAGE, TWO-DIMENSIONAL IMAGE SENSOR AND METHOD FOR DRIVING TWO-DIMENSIONAL IMAGE SENSOR

(75) Inventor: Kazuhiro Uehara, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 459 days.

(21) Appl. No.: 10/520,268

(22) PCT Filed: May 12, 2003

(86) PCT No.: PCT/JP03/05858

§ 371 (c)(1),
(2), (4) Date: Jan. 6, 2005

(87) PCT Pub. No.: WO2004/008541

PCT Pub. Date: Jan. 22, 2004

(65) Prior Publication Data

US 2005/0224698 A1 Oct. 13, 2005

(30) Foreign Application Priority Data

Jul. 10, 2002 (JP) .............................. 2002-201303

(51) Int. Cl.
*H01L 27/00* (2006.01)
(52) U.S. Cl. .............................. 250/208.1; 250/370.08; 348/294
(58) Field of Classification Search .............. 250/208.1, 250/214.1, 214 R, 370.08, 370.09; 257/290–292, 257/443, 447; 348/294, 297, 302, 308
See application file for complete search history.

(56) References Cited

U.S. PATENT DOCUMENTS 5,464,977 A * 11/1995 Nakagiri et al. ............ 250/234
2006/0237647 A1* 10/2006 Ikeda et al. .................. 250/330

FOREIGN PATENT DOCUMENTS

| JP | 6-98079 | 4/1994 |
| JP | 2796336 | 6/1998 |
| JP | 3019632 | 1/2000 |
| JP | 2002-77522 | 3/2002 |
| JP | 2002-199282 | 7/2002 |

OTHER PUBLICATIONS

Kobayashi et al, "Amorphous silicon 2-dimensional image sensor and its applications", ITE Technical Report, vol. 17, No. 16, pp. 25-30, Mar. 1993.

* cited by examiner

Primary Examiner—Kevin Pyo
(74) Attorney, Agent, or Firm—Nixon & Vanderhye, P.C.

(57) ABSTRACT

A sensor substrate (20) which includes phototransistors (7), each having a photosensitive semiconductor layer, and auxiliary capacitances (17) connected to the drain electrodes D of the corresponding phototransistors (7), and detecting ICs (25) for detecting a photoelectric conversion amount of the sensor substrate (20), which is connected to a source electrode S of the phototransistor (7), are provided. In the auxiliary capacitance (17), a predetermined amount of charge is stored, and also stored are the charge as generated by an emission of a light beam onto a photosensitive semiconductor layer in the non-conductive state of the phototransistor (7). Each detecting IC (25) detects a photoelectric conversion amount of the sensor substrate (20) based on the amount of charge remaining in the auxiliary capacitance (17).

21 Claims, 18 Drawing Sheets

METHOD FOR DETECTING PHOTOELECTRIC CONVERSION AMOUNT AND PHOTOELECTRIC CONVERTER, METHOD FOR INPUTTING IMAGE AND DEVICE FOR INPUTTING IMAGE, TWO-DIMENSIONAL IMAGE SENSOR AND METHOD FOR DRIVING TWO-DIMENSIONAL IMAGE SENSOR

This application is the US national phase of international application PCT/JP2003/005858 filed 12 May 2003 which designated the U.S. and claims benefit of JP 2002-201303, dated 10 Jul. 2002, the entire content of which is hereby incorporated by reference.

TECHNICAL FIELD

The present invention relates to a photoelectric converter for detecting a photoelectric conversion amount as converted by a photoelectric conversion element, and more particularly relates to an image input device and a two-dimensional image sensor adopting such photoelectric converter, suited for personal computers, information terminal equipments, etc.

BACKGROUND ART

Conventionally, as means for inputting an image in a personal computer, a facsimile machine, etc., adopted is an image input device (an image scanner, for example) adopting a combination of a 1D image sensor and a mechanical scanner. For such image input device, a mechanical scanning is necessary to scan an image in a document either by moving the 1D image sensor relative to the document or moving the document relative to the 1D image sensor. A problem therefore arises in that the speed of reading images is lowered, or the apparatus cannot be reduced in size and weight as desired.

On the other hand, various types of close coupling image sensors which do not require mechanical scanning have been proposed. Such two-dimensional image sensors generally include pixels arranged in a 2D matrix form, each pixel being made up of a pixel selection transistor which serves to prevent crosstalk, and a photodiode or a photo transistor, which functions as a photosensor.

The foregoing two-dimensional image sensor is typically arranged such that the amount of charge generated according to an amount of light incident on each photosensor is stored in each pixel, and an amount of charge is read from each pixel by conducting pixel selection transistors in order by electric scanning. For such two-dimensional image sensor, for example, ITE Technical Report Vol. 17. No. 16. pp 25 to 30 discloses a test sample adopting a pin photodiode as a photosensor.

Incidentally, to realize a high density pixel, the structure which adopts a pixel selection transistor and a photosensor as one integral part has been proposed. For example, Japanese Patent No. 2796336 (Japanese Laid-Open Patent Application No. 2-246272/1990 Tokukaihei 2-246272/2000 (published on Oct. 2, 1990), and Japanese Patent No. 3019632 (Japanese Laid-Open Patent Application No. 6-132560/1994 Tokukaihei 6-132560/1994 (published on May 13, 1994)) discloses the structure wherein the photosensor itself functions not only as a photosensor but also to select pixel to realize a pixel with a smaller area.

For the described beneficial features which realize high speed image reading, lighter weight, thinner structure without requiring mechanical scanning, various types of close coupling two-dimensional image sensors have been proposed, but none of them have not yet been used in practical applications.

Essential factors which hinder the practical applications of the foregoing close coupling image sensor include the complex structure of the pixel and the array. Specifically, to fabricate a photosensor, a larger number of processes are needed, or the pixel of more complicated structure is needed, or a larger pixel area is required as compared to the case of fabricating the TFT array adopted in the active matrix liquid crystal array subjected to mass production, and a higher resolution is therefore difficult to be realized.

For the arrangement wherein the photosensor itself serves not only as a photosensor but also as a member for selecting the pixel, such complicated structure that an inverse stagger type thin film transistor and a stagger type thin film transistor are combined by adopting a semiconductor layer of a monolayer structure is adopted, and the complicated manufacturing processes are therefore needed.

The present invention is achieved in view of the foregoing problems associated with the conventional structure, and it is therefore an object of the present invention to provide a photoelectric converter which realizes a higher resolution by simplifying the pixel structure to be adopted in a photosensor, and which permits the manufacturing process to be simplified, and also to provide an image input device and a two-dimensional image sensor adopting such photoelectric converter.

DISCLOSURE OF INVENTION

In order to achieve the foregoing object, the method of detecting a photoelectric conversion amount of the present invention, for detecting a photoelectric conversion amount of a photoelectric converter which comprises a thin film transistor including a photosensitive semiconductor layer, is characterized by comprising the steps of:

(1) storing a predetermined amount of charge in an auxiliary capacitance connected to a drain electrode of the thin film transistor;

(2) emitting a light beam onto the photosensitive semiconductor layer for a predetermined time in a non-conductive state of the thin film transistor after carrying out the step (1); and (3) detecting the photoelectric conversion amount that is an amount of an optical current as converted by the photoelectric converter, based on an amount of charge remaining in the auxiliary capacitance after the step (2).

According to the foregoing structure, by emitting a light beam onto the photosensitive semiconductor layer of the thin film transistor, a drain current flows across the drain electrode and the source electrode of the thin film transistor, and the amount of charge corresponding to the drain current as generated in the auxiliary capacitance is released. Here, the amount of charge to be released is equivalent to the amount of optical current (hereinafter referred to as a photoelectric conversion amount).

Therefore, by storing a predetermined amount of charge beforehand in the auxiliary capacitance, it is possible to detect a photoelectric conversion amount based on the amount of charge remaining in the auxiliary capacitance after releasing therefrom the charge with an application of a light beam.

As described, by detecting the amount of charge remaining in the auxiliary capacitance, the photoelectric conversion amount can be detected. Therefore, as compared to the case of detecting the optical current itself as generated by emitting a light beam, it is possible to simplify the structure of the circuit (photosensor) for detecting the photoelectric conversion amount.

Generally, for the method of detecting the photoelectric conversion amount based on a current value or a voltage value as detected, it is extremely difficult to store the current or the voltage, and the circuit of a complex structure is needed for measuring a current value or a voltage value, which in turn makes the structure of the photosensor made up of a thin film transistor and a photoelectric conversion amount detecting section fairly complicated.

In contrast, according to the foregoing structure wherein the photoelectric conversion amount is detected based on an amount of the charge remaining in the auxiliary capacitance, only the auxiliary capacitance for storing therein the charge is needed, and thus a photosensor of a simplified structure can be realized.

Namely, as the auxiliary capacitance is a condenser, it is possible to realize a simplified structure as compared to the structure adopting the circuit for detecting an optical current.

Moreover, with the structure wherein the auxiliary capacitance is connected to the drain electrode of the thin film transistor, it is possible to manufacture the photosensor by utilizing the manufacturing process of the thin film transistor.

As described, by simplifying the pixel structure which constitutes a photosensor, it is possible to reduce the size of the photosensor. As a result, a higher resolution can be realized. Moreover, the simplified pixel structure of the photosensor also permits the manufacturing process of the photoelectric converter adopting the photosensor to be simplified.

The foregoing method of detecting photoelectric conversion amount may be further arranged such that: before storing the predetermined amount of charge in the auxiliary capacitance in the step (1), the auxiliary capacitance is completely discharged.

According to the foregoing structure, by storing the predetermined amount of charge after completely discharging the auxiliary capacitance, it is possible to control with ease the amount of charge to be stored in the auxiliary capacitance beforehand. With this structure, in the state where the charge is released with an application of a light beam after storing the predetermined amount of charge, the amount of charge remaining in the auxiliary capacitance indicates with accuracy the photoelectric conversion amount, thereby achieving the effect of detecting the photoelectric conversion amount with an improved precision.

Moreover, as the charge stored in the auxiliary capacitance is released before storing the predetermined amount of charge in the auxiliary capacitance, i.e., before detecting the photoelectric conversion amount, the charge for the previous detection data would not remain. Therefore, even when repetitively carrying out the detecting operation, it is still possible to appropriately detect a photoelectric conversion amount.

The foregoing method of detecting photoelectric conversion amount may be further arranged such that the step (1) of storing the predetermined amount of charge in the auxiliary capacitance is carried out by adopting a gate electrode driving voltage for use in driving a gate electrode of the thin film transistor.

According to the foregoing structure, a separate member is not needed for storing the predetermined amount of charge in the auxiliary capacitance, and it is therefore possible to simplify the pixel structure which constitutes the photosensor.

The foregoing method of detecting photoelectric conversion amount may be further arranged such that the step (1) of storing the predetermined amount of charge in the auxiliary capacitance is carried out by applying a voltage to one of electrodes of the auxiliary capacitance, formed on an opposite side of the one connected to a drain electrode of the thin film transistor.

According to the structure, as a voltage is applied to the electrode which is connected directly to the auxiliary capacitance, it is possible to adjust with ease the amount of charge to be stored in the auxiliary capacitance. As a result, the amount of charge stored by the electric conversion can be detected with precision, and it is therefore possible to detect the photoelectric conversion amount with an improved precision.

The foregoing method of detecting photoelectric conversion amount may be further arranged such that: the step (1) of storing the predetermined amount of charge in the auxiliary capacitance is carried out by applying a voltage to a source electrode of the thin film transistor.

Alternately, the method may be arranged such that: the charge to be released from the source electrode of the thin film transistor by emitting a light beam is erased in a non-conductive state of the thin film transistor.

According to the foregoing structure, as the charge is not detected by the thin film transistor in the non-conductive state, a detection error of the photoelectric conversion amount can be eliminated.

Here, the conductive state of the thin film transistor indicates the state wherein the charge can be stored in the auxiliary capacitance connected to the drain electrode, and the non-conductive state indicates the state in which the charge cannot be stored in the auxiliary capacitance to a sufficient level.

The foregoing method of detecting photoelectric conversion amount may be further arranged such that: during a period of detecting the photoelectric conversion amount of the photoelectric conversion element, an emission of a light beam onto the thin film transistor is stopped.

According to the foregoing structure, while detecting the photoelectric conversion amount of the photoelectric conversion element, an optical current is not generated by emitting a light beam onto the thin film transistor, and thus a detection error of the photoelectric conversion amount can be eliminated. Namely, a crosstalk in the source electrode direction of the thin film transistor, i.e., in the data direction can be prevented.

In order to achieve the foregoing object, the photoelectric converter of the present invention is characterized by including:

at least one a photoelectric conversion element provided with a thin film transistor having a photosensitive semiconductor layer and an auxiliary capacitance connected to a drain electrode of the thin film transistor; and photoelectric conversion amount detection means for detecting a photoelectric conversion amount, that is an amount of optical current as converted by the photoelectric conversion element, the photoelectric conversion amount detecting means being connected to a source electrode of the thin film transistor, wherein a predetermined amount of charge is stored in the auxiliary capacitance, and the charge stored in the auxiliary capacitance is released from the auxiliary capacitance by emitting a light beam onto the thin film transistor in a non-conductive state; and the photoelectric amount detection means detects the photoelectric conversion amount as converted by the photoelectric conversion element based on an amount of charge remaining in the auxiliary capacitance after an emission of a light beam onto the photosensitive semiconductor layer has been completed.

According to the foregoing structure, when a light beam is emitted onto the photosensitive semiconductor layer of the thin film transistor, a drain current flows across the drain electrode and the source electrode of the thin film transistor, and the charge corresponding to a drain current as generated in the auxiliary capacitance is discharged. Here, an amount of charge to be released is equivalent to an amount of optical current (hereinafter referred to as a photoelectric conversion amount).

According to the foregoing structure wherein a predetermined amount of charge is stored in the auxiliary capacitance, and then the charge is released from the auxiliary capacitance, it is possible to detect the amount of charge as stored (photoelectric conversion amount) by detecting the amount of charge remaining in the auxiliary capacitance.

As described, by detecting the photoelectric conversion amount based on the amount of charge remaining in the auxiliary capacitance, as compared to the case of detecting the optical current itself as generated by emitting a light beam, it is possible to simplify the structure of the circuit (photosensor) for detecting the photoelectric conversion amount.

Generally, for the method of detecting the photoelectric conversion amount based on a current value or a voltage value as detected, it is extremely difficult to store the current or the voltage, and the circuit of a complex structure is needed for measuring a current value or a voltage value, which in turn makes the structure of the photosensor made up of a thin film transistor and a photoelectric conversion amount detecting section fairly complicated.

In contrast, according to the foregoing structure wherein the photoelectric conversion amount is detected based on an amount of the charge remaining in the auxiliary capacitance, only the auxiliary capacitance for storing therein the charge is needed, and thus a photosensor of a simplified structure can be realized.

Namely, as the auxiliary capacitance is a condenser, it is possible to realize a simplified structure as compared to the structure adopting the circuit for detecting an optical current.

Moreover, with the structure wherein the auxiliary capacitance is connected to the drain electrode of the thin film transistor, it is possible to manufacture the photosensor by utilizing the manufacturing process of the thin film transistor.

As described, by simplifying the pixel structure which constitutes a photosensor, it is possible to reduce the size of the photosensor. As a result, a higher resolution can be realized. Moreover, the simplified pixel structure of the photosensor also permits the manufacturing process of the photoelectric converter adopting the photosensor to be simplified.

The foregoing photoelectric converter may be arranged such that the photoelectric conversion amount detection means includes an amplifier circuit for amplifying the charge to be transferred from the auxiliary capacitance.

According to the foregoing structure, even in the case where the amount of charge remaining in the auxiliary capacitance is small, as the change can be amplified by the amplifier circuit, it is still possible to accurately detect the photoelectric conversion amount.

In order to achieve the foregoing object, the image input method for inputting as image data, an optical current generated by a light reflected from a document image as converted by a photoelectric conversion element provided with a thin film transistor including a photosensitive semiconductor layer, is characterized by including the steps of:

(1) storing a predetermined amount of charge in an auxiliary capacitance connected to a drain electrode of the thin film transistor;

(2) emitting a light beam onto the photosensitive semiconductor layer for a predetermined time in a non-conductive state of the thin film transistor after carrying out the step (1) of storing the predetermined amount of charge in the auxiliary capacitance; and (3) detecting a photoelectric conversion amount that is an amount of optical current as converted by the photoelectric conversion element based on an amount of charge remaining in the auxiliary capacitance after carrying out the step (2) of emitting a light beam onto the photosensitive semiconductor layer for the predetermined time, and outputting the result of detection as image data.

According to the foregoing structure, when a light beam is emitted onto the photosensitive semiconductor layer of the thin film transistor, a drain current flows across the drain electrode and the source electrode of the thin film transistor, and the charge corresponding to a drain current as generated in the auxiliary capacitance is discharged. Here, an amount of charge to be released is equivalent to an amount of optical current (hereinafter referred to as a photoelectric conversion amount).

According to the foregoing structure wherein a predetermined amount of charge is stored in the auxiliary capacitance, and then the charge is released from the auxiliary capacitance, it is possible to detect the amount of charge as stored (photoelectric conversion amount) by detecting the amount of charge remaining in the auxiliary capacitance.

As described, by detecting the photoelectric conversion amount based on the amount of charge remaining in the auxiliary capacitance, the optical current can be detected accurately, and by preparing the image data based on the resulting photoelectric conversion amount, it is possible to input image data with accuracy.

In order to achieve the foregoing object, the image input device of the present invention is characterized in that the photoelectric converter of the foregoing structure provided in plural number, each corresponding to a document image; and image data output means for outputting, as input image data of the document image, the photoelectric conversion amount converted by the photoelectric conversion element as detected by each of the plurality of the photoelectric converters.

By adopting the photoelectric converter of the foregoing structure, an image input device of high resolution can be realized, and it is therefore possible for the image data output means to output fairly fine input image data.

The image input device of the present invention is further including:

light emission means for projecting a red light beam, a green light beam and a blue light beam onto a document image, wherein:

the image data output means outputs image data as input from a photoelectric conversion amount that is an amount of optical current converted by the photoelectric conversion element as detected according to light beams in respective colors emitted from the light emission means.

According to the foregoing structure, it is possible to obtain a fairly fine color image.

In the foregoing image input device, the photoelectric converter is arranged in 1D or in 2D.

By adopting the photoelectric converter arranged in 1D, the image input device of the present invention can be suitably applied to a portable image input device such as a handy scanner, etc., adopted in a home facsimile machine.

On the other hand, by adopting the photoelectric converter arranged in 2D, the image input device of the present invention can be suitably applied to the flat head scanner, etc. In this case, it is possible to read the entire document image at once.

In order to achieve the foregoing object, the two-dimensional image sensor in accordance with the present invention is characterized by including:

a plurality of data lines;

a plurality of scanning lines which interest the data lines;

a photoelectric conversion element including i) a plurality of thin film transistors, each including a photosensitive semiconductor layer, provided at respective intersections between the plurality of data lines and the plurality of scanning lines, and ii) auxiliary capacitances for storing the charge, the auxiliary capacitances being connected to respective drain electrodes of the plurality of thin film transistors;

photoelectric conversion amount detection means for detecting a photoelectric conversion amount that is an amount of optical current as converted by each of the plurality of photoelectric conversion elements, the photoelectric conversion amount detection means being connected to respective source electrodes of the thin film transistors; and image data output means for outputting as image data, a result of detection by each of the photoelectric conversion amount detection means, wherein a predetermined amount of charge is stored in each of the plurality of auxiliary capacitances, and the charge is released from the auxiliary capacitance by emitting a light beam in a non-conductive state of corresponding thin film transistor; and the photoelectric amount detection means detects a photoelectric conversion amount that is an amount of an optical current as converted by the photoelectric conversion element based on an amount of charge remaining in the auxiliary capacitance after an emission of a light beam onto the photosensitive semiconductor means has been completed.

According to the foregoing structure, it is possible to read the two-dimensional image with a simple structure.

The foregoing two-dimensional image sensor may be arranged such that the plurality of data lines, the plurality of scanning lines, the thin film transistors and the plurality of auxiliary capacitances are formed on a transparent substrate.

The foregoing two-dimensional image sensor may be arranged such that a transparent protective film is formed on a surface of the transparent substrate on a side where the plurality of thin film transistors are formed.

The foregoing two-dimensional image sensor may be further arranged such that the light emission means is provided on a surface of the transparent substrate on an opposite side where the plurality of thin film transistors are formed.

The two-dimensional image sensor may be arranged so as to further include:

light emission control means for controlling an emission of light beams from the light emission means, wherein after storing a predetermined amount of charge in the auxiliary capacitance, the light emission control means controls the light emission means to project a light beam for a predetermined time; and the photoelectric conversion amount detection means detects a photoelectric conversion amount that is an amount of optical current as converted by the photoelectric conversion element based on an amount of charge remaining the auxiliary capacitance in a period in which an emission of a light beam is stopped after the light beams have been emitted by the light emission means for a predetermined time.

The method of driving the foregoing two-dimensional image sensor of the present invention may be arranged so as to include the steps of:

(1) storing a predetermined amount of charge in each of the plurality of auxiliary capacitances connected to respective thin film transistors; and (2) detecting after carrying out the step (1), a photoelectric conversion amount that is an amount of optical current as converted by each of the plurality of photoelectric conversion elements based on an amount of charge remaining in the auxiliary capacitance by conducting the plurality of thin film transistors in order by driving the plurality of scanning lines.

The method of driving the foregoing two-dimensional image sensor of the present invention may be arranged so as to include the steps of:

(1) storing a predetermined amount of charge in each of the plurality of auxiliary capacitances connected to respective thin film transistors;

(2) emitting after carrying out the step (1), a light beam by the light emission means for a predetermined time; and (3) detecting the photoelectric conversion amount as converted by the photoelectric conversion element based on an amount of charge remaining in the auxiliary capacitance by conducting the plurality of thin film transistors in order by driving the plurality of scanning lines, by stopping an emission of a light beam by driving the scanning lines after the step (2).

For a fuller understanding of the nature of the invention, reference should be made to the ensuing detailed description taken in conjunction with the accompanying drawing.

BEST MODE FOR CARRYING OUT THE INVENTION

First Embodiment

The following descriptions will explain one embodiment of the present invention.

Before explaining a method for detecting a photoelectric conversion amount, a photosensor applicable to a photoelectric converter of the present invention and a two-dimensional image sensor adopting the photosensor will be explained.

Figure 3:
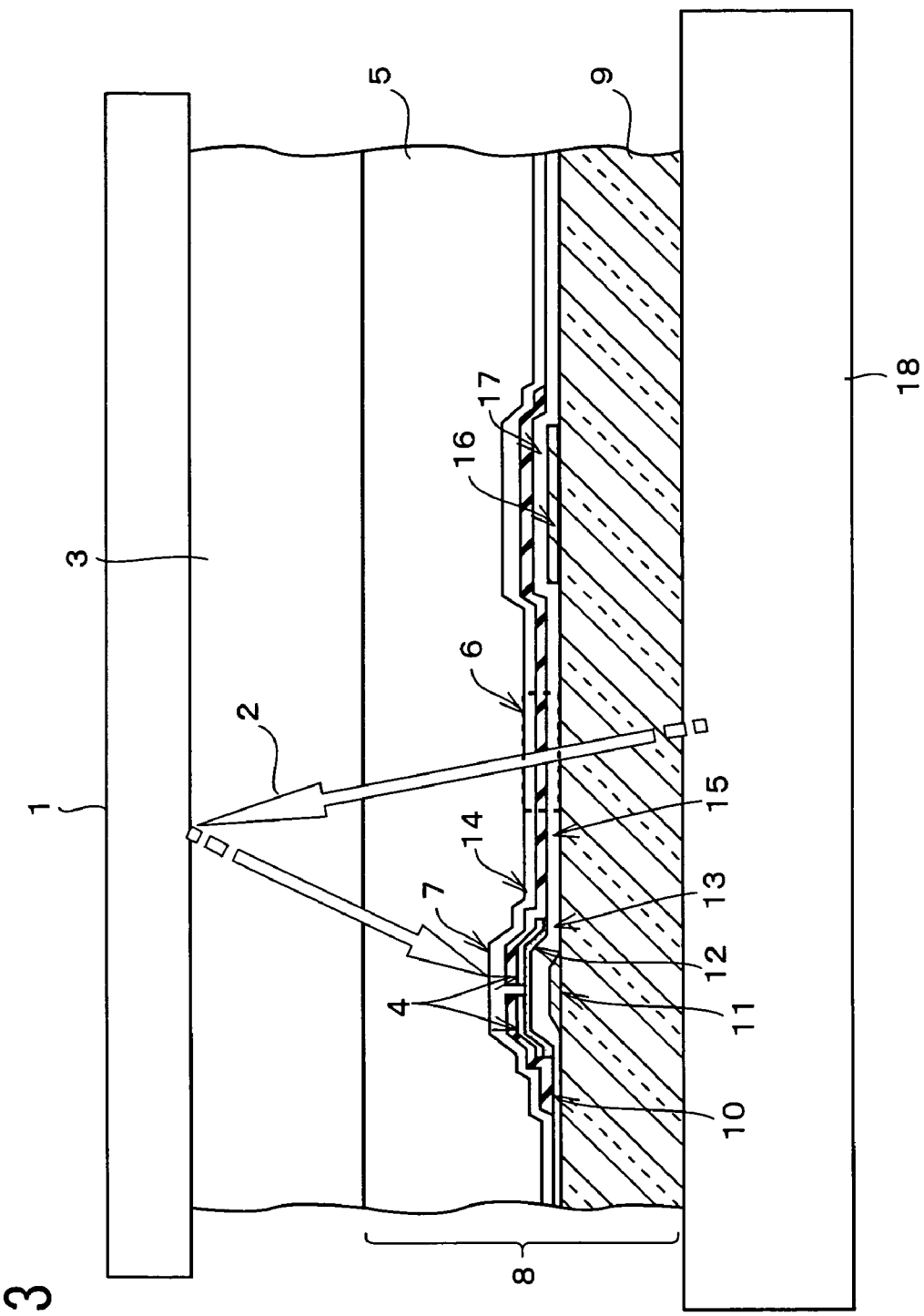
FIG. 3 is a cross-sectional view schematically showing the structure of the photoelectric converter shown in FIG. 1.

The photosensor basically has the structure of the inverse stagger type thin film transistor (TFT) (Here, the stagger type thin film transistor may be adopted, provided that an upper gate electrode is made of a transparent material). Specifically, as illustrated in FIG. 3, a phototransistor 7 is made up of a transparent dielectric substrate (transparent substrate) 9 made of glass, for example, a bottom gate electrode 11 made of chrome (Cr), etc., formed on the transparent dielectric substrate 9, and a bottom gate dielectric film (protective film) 13 made of silicon nitride (SiN) formed so as to cover the bottom electrode 11 and the dielectric substrate 9.

On the bottom gate electrode 11, formed is a semiconductor layer (photosensitive semiconductor layer) 12 made of i-type amorphous silicone (i-a-Si) so as to face the bottom gate electrode 11. Further, a source electrode 10 and a drain electrode 15 are formed so as to oppose one another having the semiconductor layer 12 in between with a predetermined interval.

The source electrode 10 and the drain electrode 15 are connected to the semiconductor layer 12 respectively via an n+silicone layer 4.

In the upper layer of the source electrode 10 and the drain electrode 15, formed is a dielectric film 14. The transistor (inversed stagger type transistor) is constituted by these members.

When a light beam 2 is emitted onto the phototransistor 7, from a back light unit 18 formed on the side of the dielectric substrate 9, the light beam 2 as emitted passes through an aperture 6 is reflected from a document 1 and is incident on the semiconductor layer 12.

Here, the phototransistor 7 controls the conductive state and the non-conductive state by controlling a voltage to be applied to the bottom gate electrode 11. Specifically, for example, it may be arranged such that with an application of a positive voltage to the gate electrode 11 of the phototransistor 7, an n-channel is formed on the semiconductor layer 12, and with an application of a positive voltage across the source electrode 10 and the drain electrode 15, electrons are supplied from the side of the source electrode 10, to flow current.

Figure 4:
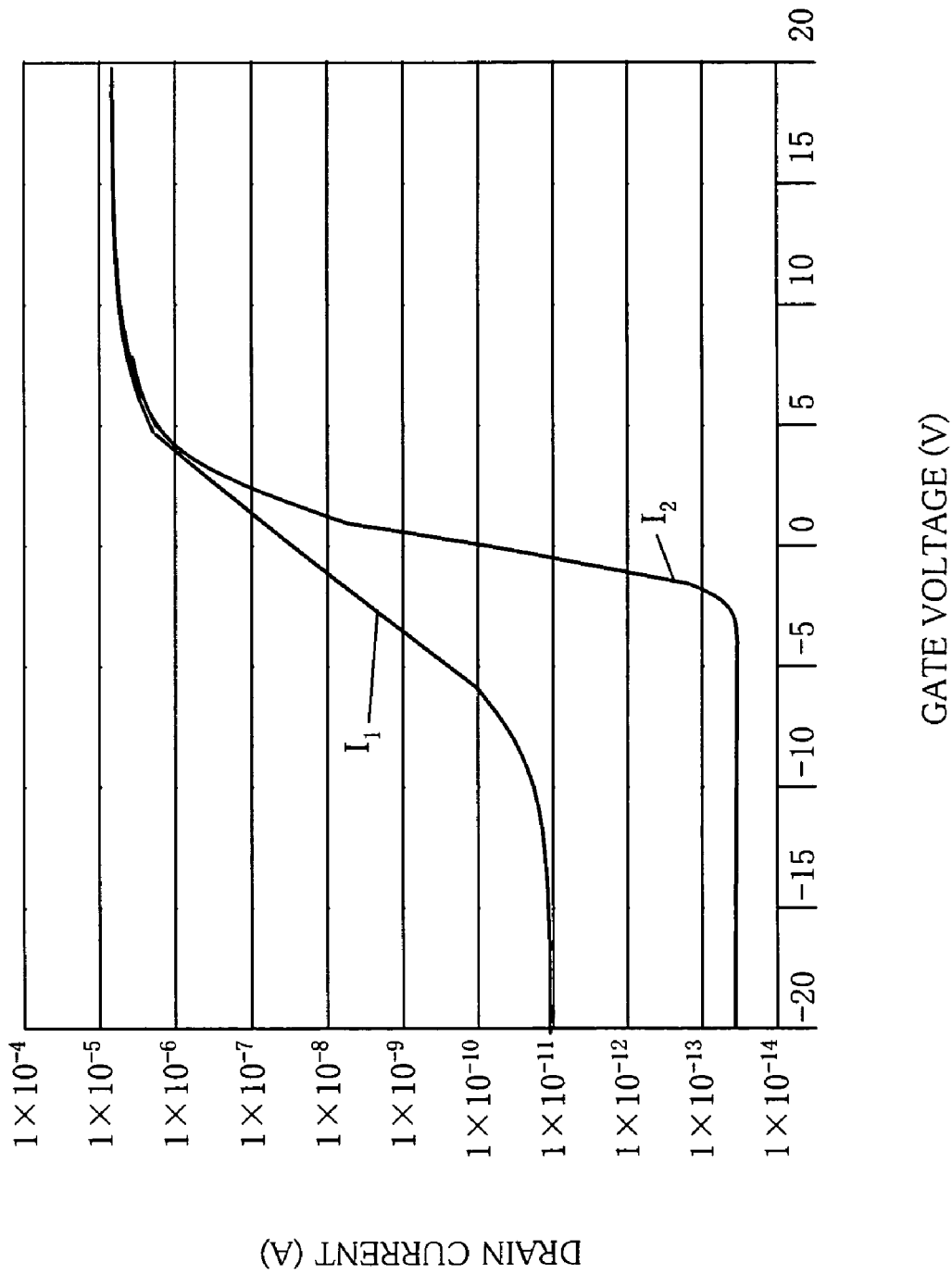
FIG. 4 is a graph showing gate voltage-drain current characteristics in the photoelectric converter shown in FIG. 3.

FIG. 4 is graph showing the relationship between the gate voltage and the drain current. In the graph of FIG. 4, the curved line I1 indicates a relationship between a gate voltage and a drain current with an application of a light beam, and the curved line I2 indicates a relationship between a gate voltage and a drain voltage without an application of a light beam.

Namely, as indicated by the curved line I1 of FIG. 4, when a light beam is emitted in the non-conductive state (in the state where a negative voltage is applied to the gate electrode 11), an optical current is excited in the semiconductor layer 12, and the drain current flows across the source electrode 10 and the drain electrode 15 according to the number of electron holes excited by emitting a light beam, i.e., according to an amount of light emitted. On the other hand, when a light beam is not emitted, as indicated by the curved line I2 of FIG. 4, the drain current is extremely small, specifically, around 10-14 A (ampere), for example. With this structure, the phototransistor 7 has a significant difference in drain current between the drain current (I1) with an emission of a light beam and the drain current (I2) without an emission of a light beam. Further, by storing the drain current with an emission of a light beam and the drain current without an application of a drain current, it is possible to increase the difference in drain current, thereby realizing a photoelectric converter with a large dynamic range.

The second image sensor utilizing the photoelectric converter having the foregoing structure as a photosensor will be explained in reference to FIG. 5 and FIG. 6.

Figure 5:
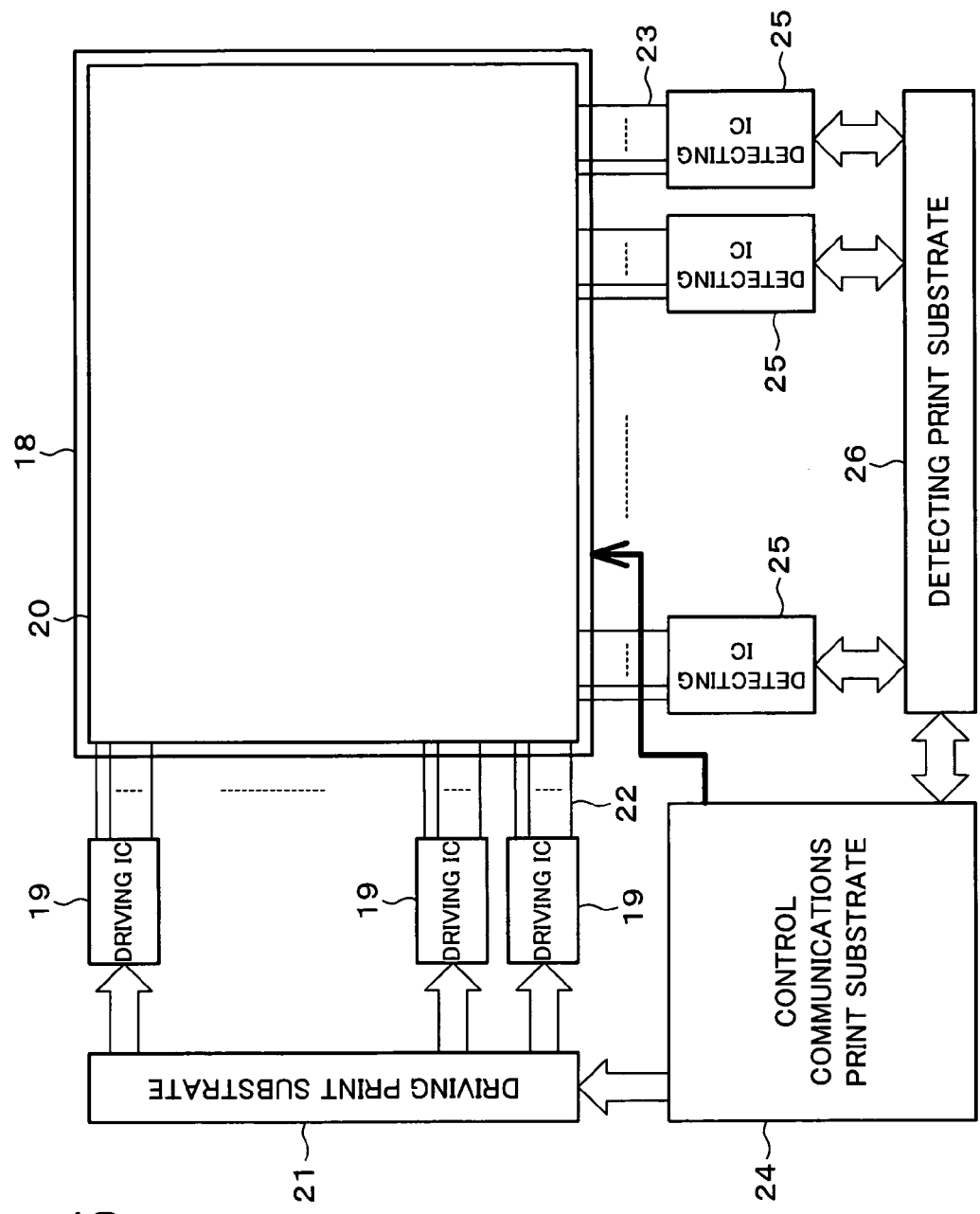
FIG. 5 is a block diagram schematically showing a two-dimensional image sensor adopting the photoelectric converter shown in FIG. 1.

FIG. 5 is a block diagram schematically showing the structure of the two dimensional image sensor. FIG. 6 is a perspective view schematically showing the two dimensional image sensor. The two-dimensional image sensor of this example is a close coupling image sensor. In the present embodiment, explanations will be given through the case of the two dimensional image sensor. However, the photoelectric converter of the present invention is also applicable to the 1D image sensor as a photosensor.

As shown in FIG. 5, the two-dimensional image sensor in accordance the present embodiment includes a plurality of pixels (not shown) arranged in a matrix form, and a flat plate shaped sensor substrate (20) which constitutes a sensor section (photosensor). Further, a plurality of driving ICs 19 and a plurality of detecting ICs 25 (photoelectric conversion amount) provided in the periphery of the sensor substrate 20 are connected to the sensor substrate 20. Each driving IC 19 is provided for driving TFTs 7 shown in FIG. 1 (to be described later) formed on the sensor substrate 20 for respective pixels, and is connected to gate lines 22 of the sensor substrate 20. The gate lines 22 are provided in the total number of some hundreds to some thousands although the number varies depending on factors such as the size of the sensor substrate 20, the pixel pitch, etc. These gate lines 22 are divided into a plurality of groups, and gate lines 22 in each group are connected to the same driving IC 19. In this case, the number of output terminals of each driving IC 19 is some hundreds, for example.

Figure 6:
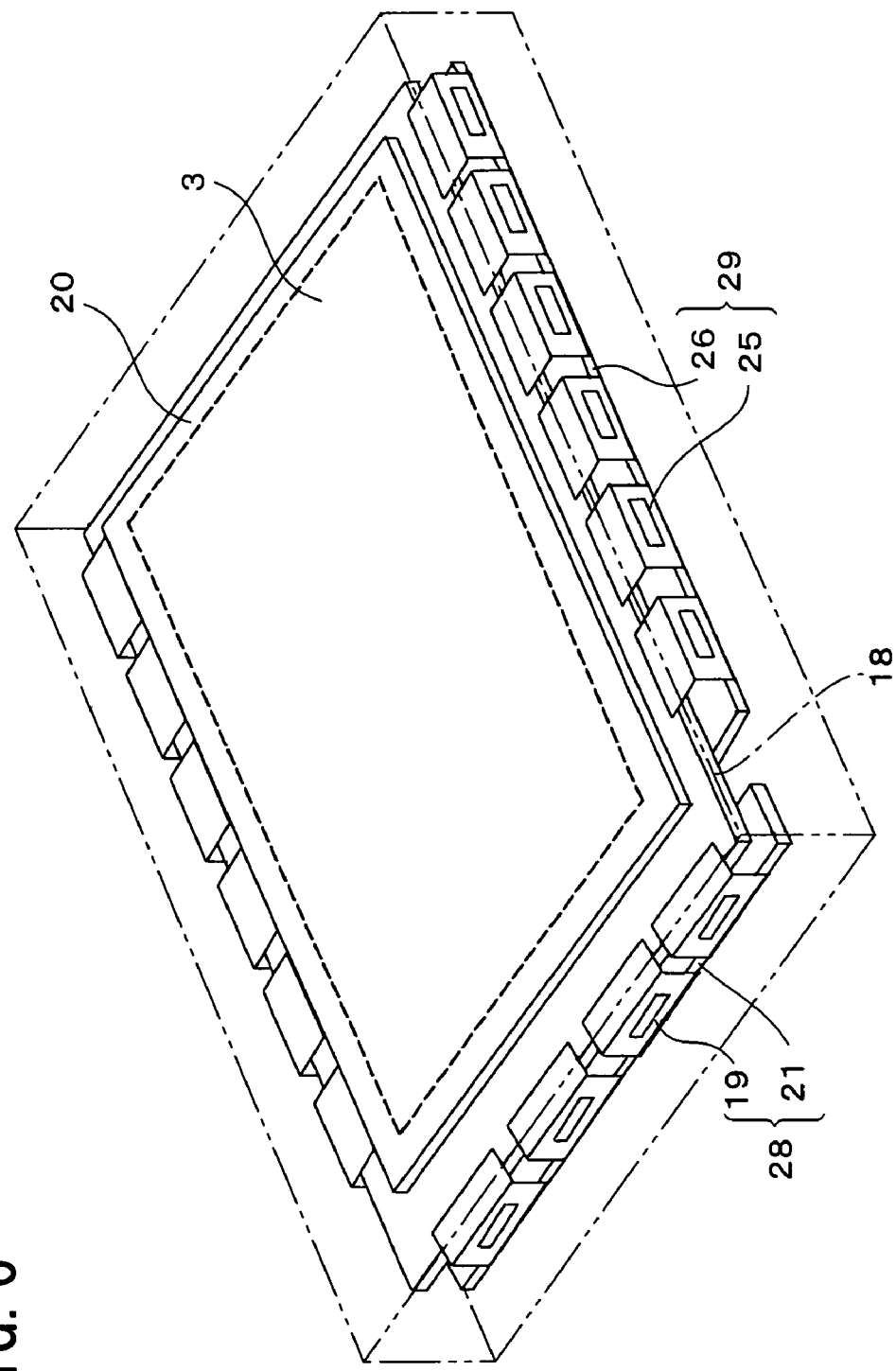
FIG. 6 is a perspective view schematically showing the structure of a two-dimensional image sensor shown in FIG. 5.

As shown in FIG. 6, these driving ICs 19 are mounted to a driving print substrate 21. The driving ICs 19 and the driving print substrate 21 constitute a driving circuit 28.

The driving print substrate 21 is connected to a control/communication substrate (light emission control means) 24. This driving print substrate 21 includes a circuit which controls the driving ICs 19 and interfaces with control/communication substrate 24.

On the other hand, the detecting ICs 25 are provided for detecting an output from the sensor substrate 20, obtained as a result of driving the TFTs 7 formed on the sensor substrate 20. Each detecting IC 25 is connected to data lines 23 of the sensor substrate 20. The data lines 23 are provided in the total number of some hundreds to some thousands although the number varies depending on factors such as the size of the sensor substrate 20, the pixel pitch, etc., and these data lines 23 are divided into a plurality of groups, data lines 23 in each group are connected to the same detecting ICs 25. In this case, the number of output terminals of each detecting IC 25 is some hundreds, for example.

As shown in FIG. 6, these detecting ICs 25 are mounted to a detecting print substrate 26 (image data output means). The detecting ICs 25 and the detecting print substrate 26 constitute a detecting circuit 29 (detection means).

The detecting print substrate 26 is connected to a control/communication substrate 24. This detecting print substrate 26 includes a circuit which controls the detecting ICs 25 and interfaces with control/communication substrate 24.

The control/communication substrate 24 includes circuits for reading lines of the sensor substrate 20 by scanning or for dealing with signals which are not in sync with the frame frequency, such as CPU, memory, etc. This control/communication substrate 24 controls communications with a peripheral circuit and the photoelectric converter as a whole.

The back light unit 18 is made up of an LED, a light guide plate and a photo diffusion plate.

The on/off of the LED is controlled by the control/communication substrate 24.

As illustrated in FIG. 6, the two-dimensional image sensor of the foregoing structure is arranged such that the driving print substrate 21 and the detecting print substrate 26 are provided so as to come under the surface of the back light unit 18 on the opposite side of the sensor substrate 29. In this structure, each of the driving ICs 19 and the detecting ICs 25 have a cross section in a shape of a horseshoe. With this structure, it is possible to realize a compact size two-dimensional image sensor.

The two-dimensional image sensor includes a transparent protective film 3 formed so as to cover the surface in a predetermined area of the sensor substrate 20 which serves as the sensor section.

Figure 1:
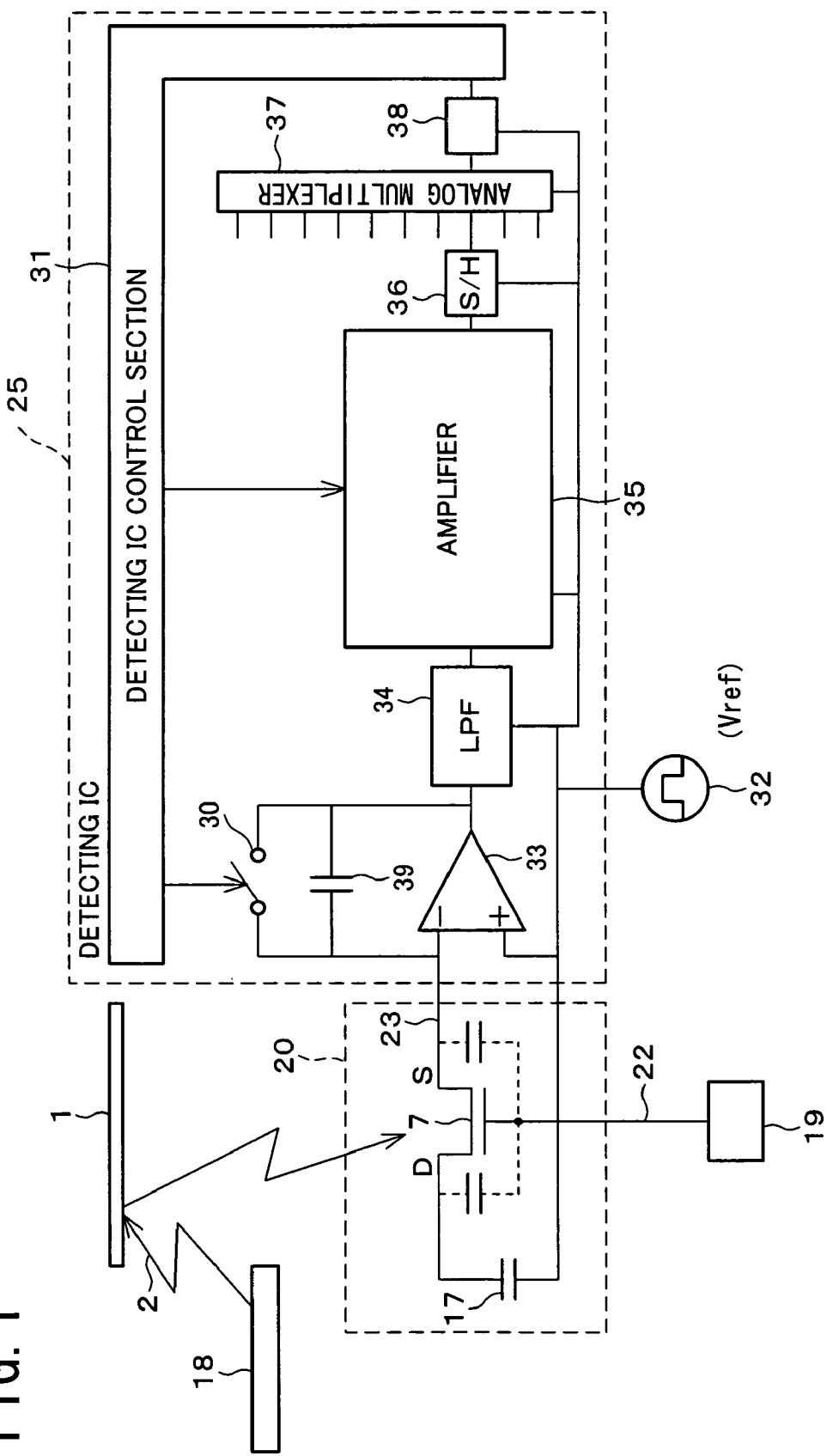
FIG. 1 is a block diagram schematically showing the structure corresponding to one pixel of a photoelectric converter in accordance with the present invention.
Figure 2:
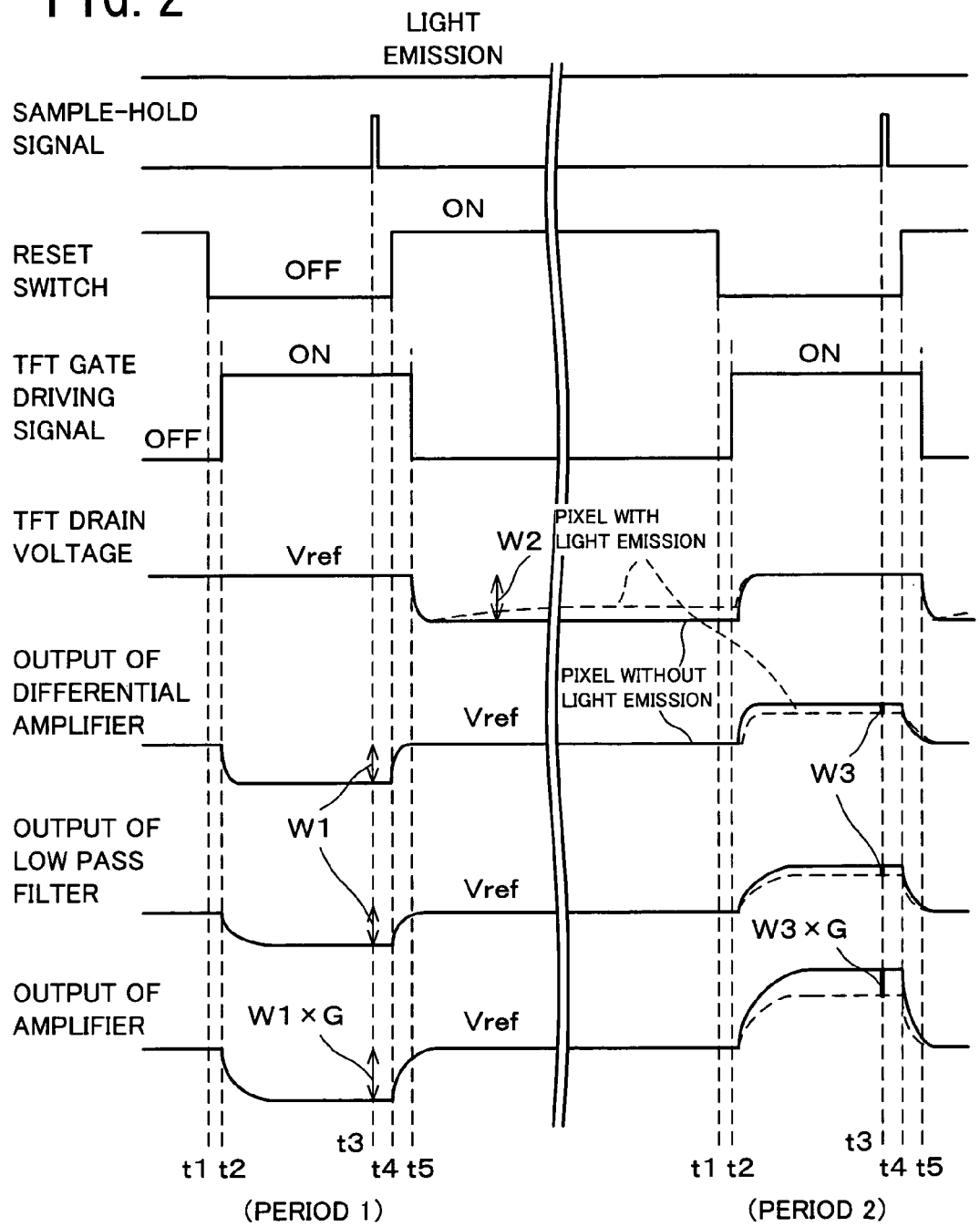
FIG. 2 is a timing chart showing detecting operations in the photoelectric converter shown in FIG. 1.

The operation of the photosensor of the foregoing structure will be explained in reference to FIG. 1 through FIG. 4. Here, FIG. 1 is a block diagram schematically showing the structure of the photosensor for one pixel. FIG. 2 shows a timing chart of a signal flowing in the photosensor of FIG. 1.

As shown in FIG. 3, when a light beam 2 is emitted to the phototransistor 7, from the back light unit 18 formed on the side of the dielectric substrate 9, the light beam 2 as emitted passes through the aperture 6 is reflected from the document 1 and is incident on the semiconductor layer 12. Here, the phototransistor 7 controls the conductive state and the non-conductive state by controlling a voltage to be applied to the bottom gate electrode 11. Specifically, for example, it may be arranged such that with an application of a positive voltage to the gate electrode 11 of the phototransistor 7, an n-channel is formed on the semiconductor layer 12, and with an application of a positive voltage across the source electrode 10 and the drain electrode 15, electrons are supplied from the side of the source electrode 10, to flow current.

As indicated by the curved line I1 of FIG. 4, when a light beam is emitted in the non-conductive state (in the state where a negative voltage is applied to the gate electrode 11), an optical current is excited in the semiconductor layer 12, and the drain current flows across the source electrode 10 and the drain electrode 15 according to the number of electron holes excited with an emission of a light beam, i.e., according to an amount of light emitted. On the other hand, when a light beam is not emitted, as indicated by the curved line I2 of FIG. 4, the drain current is extremely small, specifically, the amount of drain current can be reduced to around 10-14 A (ampere), for example.

With this structure, the phototransistor 7 has a significant difference in drain current between the drain current (I1) with an emission of a light beam and the drain current (I2) without an emission of a light beam.

Further, by storing a predetermined amount of charge in the auxiliary capacitance 17, and then releasing the charge by the drain current with an emission of a light beam and a drain current without an emission of a light beam for a predetermined time period, and then detecting the amount of charge remaining in the auxiliary capacitance 19 by the detecting IC 25, it is possible to increase the difference in drain current, thereby realizing a photoelectric converter with a large dynamic range.

As illustrated in FIG. 1, the detecting IC 25 includes a charge sensitive amplifier (CSA) 33, a low pass filter 34, an amplifier 35, a sample and hold circuit 36, etc., for the number lines to be detected (several hundreds lines, for example) and also includes the analog multiplexer 37 and the A/D (analog/digital) conversion circuit 38 in the latter stage of the sample and hold circuit 36.

This detecting IC 25 is arranged so as to carry out a dual correlation sampling to offset and remove noise for each circuit.

In such detecting IC 25, the charge stored in the auxiliary capacitance 17 as input to the detecting IC 25 through the data lines 23 is input to the charge sensitive amplifier 33 as a negative input, and then from the charge sensitive amplifier 33, output is a potential in proportion to the charge as input. To the positive input terminal of the charge sensitive amplifier 33, connected is the reference voltage (Vref) 32.

The output from the charge sensitive amplifier 33 is input to the amplifier 35 through the low pass filter 34 which serves to reduce noise, and is then output after being amplified to a predetermined number of times.

The output from the amplifier 35 is input to and is once held in the sample and hold circuit 36, and the value as held is output to one of the input terminals of the analog multiplexer 37.

The output from the analog multiplexer 37 is input to the A/D conversion circuit 38 in the next stage, and in the A/D conversion circuit 38, the data as input is converted from the analog data to digital data to be output to the control/communication substrate 24 as image data.

The charge sensitive amplifier 33 is provided with a reset switch 30, which is switched ON/OFF by an output from a control section 31 of the detecting IC 25. This control section 31 controls the detecting IC 25, and interfaces the detecting print substrate 26.

Next, operations of each section of the photosensor of the foregoing structure will be explained in reference to the time chart of FIG. 2. FIG. 2 indicates a time chart of each section in the photosensor. In this time chart, it is assumed that before the time t1 in the period 1, the charge is not stored in the auxiliary capacitance 17.

(1) From Time t1 to t3 in the Period 1

At t1 of the period 1, the reset switch 30 of the charge sensitive amplifier 33 is switched from the ON state to the OFF state, and the reset of the charge sensitive amplifier 33 is then cancelled. At t2, when the TFT 7 is turned on with an output of a gate drive signal, the "feed-through" phenomenon appears, and the charge is transferred from the gate to the drain D and the source S, and by the charge (electron hole) as received, the output from the charge sensitive amplifier 33 is reduced. The foregoing "feed-through" phenomenon occurs by the following mechanism. That is, in the TFT 7, there exists a part overlapped with a gate at portions between the gate and the drain D and between the gate and the source S, and a parasitic capacitance exists in that overlapped portion (see FIG. 1).

In FIG. 2, the charge sensitive amplifier has such waveform that a value W1 is smaller at time t3 than that at t1 due to the feed-through phenomenon. Here, the output from the charge sensitive amplifier 33 is subjected to a delay in fall by the time constant of the data line 23 of the sensor substrate 20.

The output from the low pass filter 34 which receives an output from the charge sensitive amplifier 33 is reduced towards an output value of the charge sensitive amplifier 33 in the period after t2 with a time constant, and is reduced finally to a value W1.

The output from the amplifier 35 which receives an output from the low pass filter 24 is reduced towards an output value×G (gain) of the charge sensitive amplifier 33, and is reduced finally to a value W1×G, and this value W1×G is sampled and held at t3. This value W1×G is a feed-through signal component.

(2) From Time t4 to t5 in the Period 1

At t4 of the period 1, the reset switch 30 of the charge sensitive amplifier 33 is switched from the ON state to the OFF state, and a feedback capacitance 39 of the charge sensitive amplifier 33 is then shorted. Here, the output from the charge sensitive amplifier 33 becomes a reference value (Vref), and therefore the respective outputs from the low pass filter 34 and the amplifier 35 also become Vref.

At t5, when the supply of the gate drive signal of the TFT 7 is stopped, the feed-through phenomenon appears, and the charge (electrons) is transferred into the feedback capacitance 39 of the charge sensitive amplifier 33. In this state, however, as the charge sensitive amplifier 33 is in the reset state, the charge as received disappears. On the other hand, by the feed-through phenomenon due to the parasitic capacitance between the gate and the drain D of the TFT 7, the charge (electrons) is transferred into the auxiliary capacitance 17, and the TFT drain voltage is reduced by W2.

In this state, by emitting a light beam onto the TFT 7 for a predetermined time, the charge stored in the auxiliary capacitance 17 is transferred to the source S of the TFT 7 by an optical current, and with this transfer of the charge, the drain voltage of the TFT 7 is increased (from t5 in the period 1 to t2 in the period 2 (dotted line in FIG. 2)). For the TFT 7 without an emission of a light beam, an optical current does not generate, and the charge is therefore stored in the auxiliary capacitance 17, and the TFT drain voltage remains unchanged (from t5 in the period 1 to t2 in the period 2 (solid line in FIG. 2)).

(3) From Time t1 to t3 in the Period 2

At t1 of the period 2, the reset switch 30 of the charge sensitive amplifier 33 is switched from the ON state to the OFF state, and the reset of the charge sensitive amplifier 33 is then cancelled. At t2, when the TFT 7 is turned on with an output of a gate drive signal, the feed-through phenomenon appears, and the charge is transferred from the gate to the drain D and the source S, and by the charge (electron hole) as received, the output from the charge sensitive amplifier 33 is reduced. Here, the charge (electrons) as applied to the auxiliary capacitance 17 at t5 in the period 1 is also transferred to the side of the source S. In this state, an amount of charge is varied according to an emission of a light beam onto the TFT.

FIG. 2 shows the case in which the entire TFT (pixel) receives light, and the case in which the TFT does not receive light. The difference in amount of charge causes a difference of W3 (t3) between the output of the charge sensitive amplifier of the TFT with an emission of light and the output of the charge sensitive amplifier of the TFT without an emission of light beam. The output from the charge sensitive amplifier 33 is reduced finally to W3×G, and this value is sampled and held at t3. This value as sampled and held indicates a difference between a detection value of a pixel with an emission of a light beam and a detection value of a pixel without an emission of a light beam.

(4) From Time t4 to t5 in the Period 2

At t4 of the period 2, the reset switch 30 of the charge sensitive amplifier 33 is switched from the ON state to the OFF state, and a feedback capacitance 39 of the charge sensitive amplifier 33 is then shorted. Here, the output from the charge sensitive amplifier 33 becomes a reference value (Vref), and therefore the respective outputs from the low pass filter 34 and the amplifier 35 also become Vref.

At t5, when the supply of the gate drive signal of the TFT 7 is stopped, the feed-through phenomenon appears, and the charge (electrons) is transferred into the feedback capacitance 39 of the charge sensitive amplifier 33. In this state, however, as the charge sensitive amplifier 33 is in the reset state, the charge as received disappears. On the other hand, by the feed-through phenomenon due to the parasitic capacitance between the gate and the drain D of the TFT 7, the charge (electrons) is transferred into the auxiliary capacitance 17, and the TFT drain voltage is reduced by W2.

In this state, by emitting a light beam onto the TFT 7 for a predetermined time, the charge stored in the auxiliary capacitance 17 is transferred to the source S of the TFT 7 by an optical current, and with this transfer of the charge, the drain voltage of the TFT 7 is increased (at or after t5 in the period 2). For the TFT 7 without an emission of a light beam, an optical current does not generate, and the charge is therefore stored in the auxiliary capacitance 17, and the TFT drain voltage remains unchanged.

As described, by performing the operation in the period 1 and the period 2 once, it is possible to detect a photoelectric conversion amount once at t3 in the period 2. Further, by repeating the operations in the period 1 and the period 2, the foregoing detecting operation is repeated, and it is therefore possible to sequentially detect the photoelectric conversion amount at t3 respectively in the period 1 and the period 2.

Second Embodiment

Another Embodiment of the present invention will be explained. For convenience in explanations, members having the same functions as those of the second embodiment will be designated by the same reference numerals, and thus the descriptions thereof shall be omitted here. The same structures shown in FIG. 5 and FIG. 6 are adopted in the present embodiment.

Figure 7:
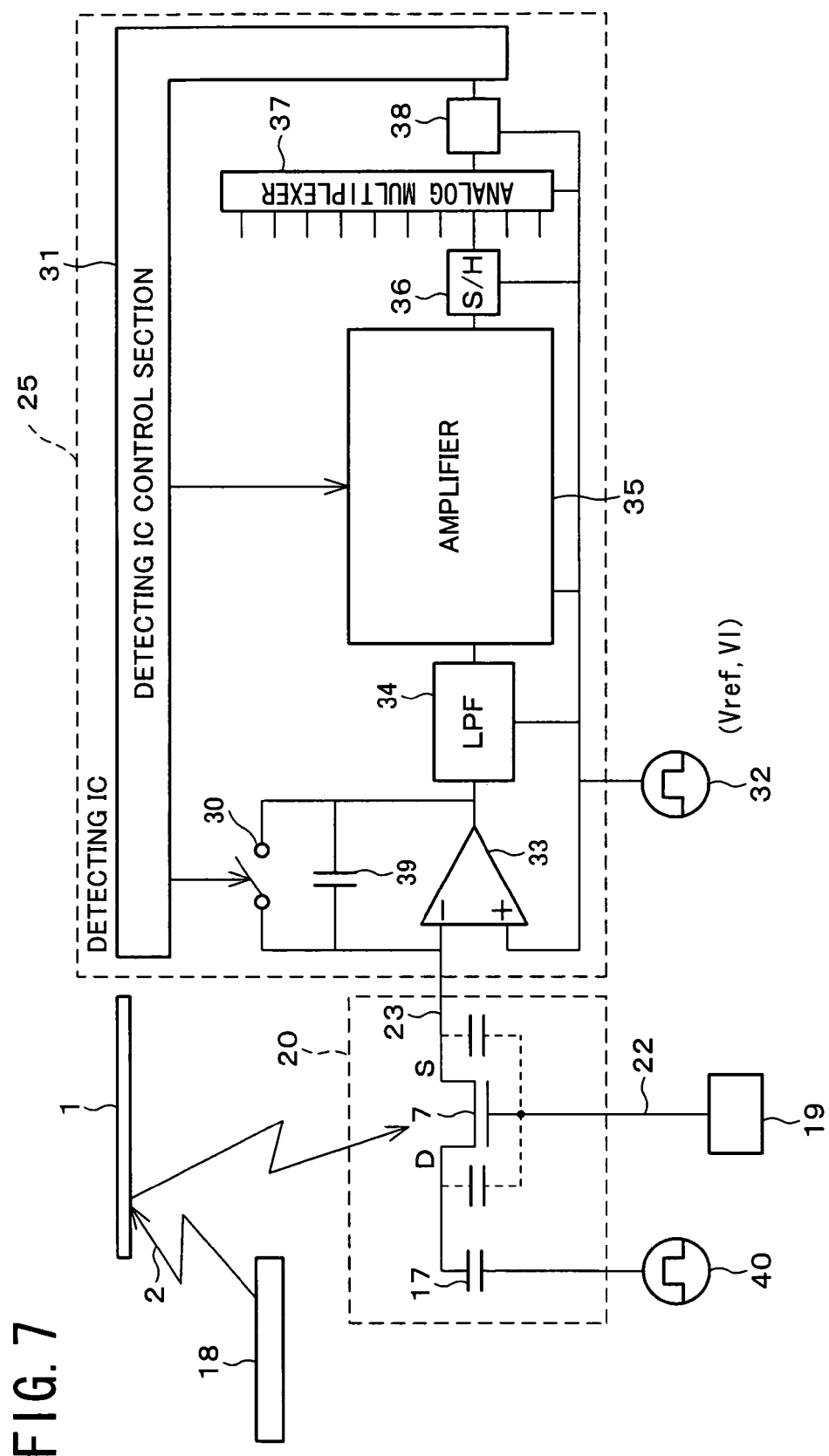
FIG. 7 is block diagram schematically showing the structure corresponding to one pixel of another photoelectric converter in accordance with the present invention.
Figure 8:
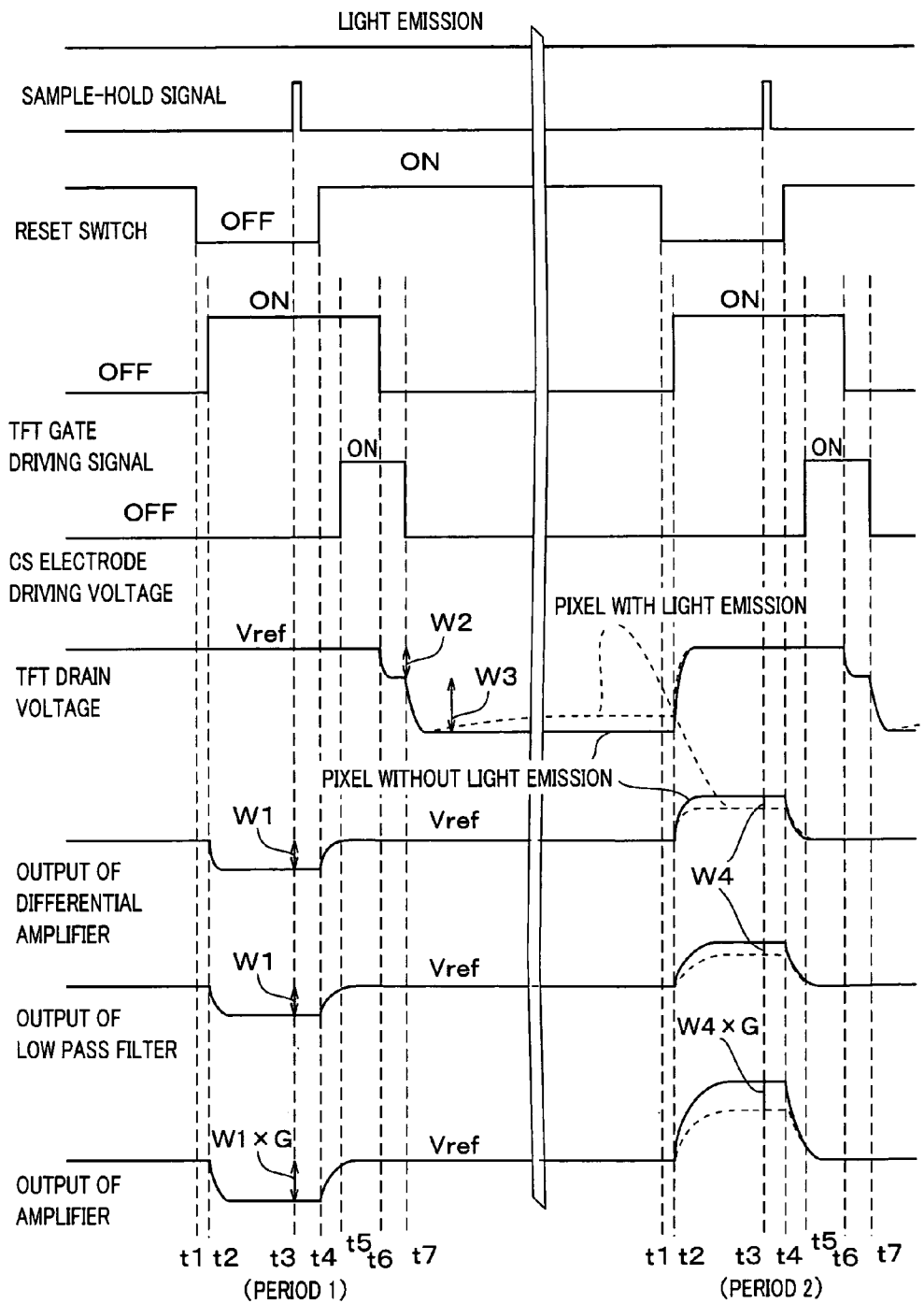
FIG. 8 is a timing chart showing a detecting operation in the photoelectric converter shown in FIG. 7.

The structure and the operation of the photosensor in accordance with the present embodiment will be explained in reference to FIG. 7 and FIG. 8. FIG. 7 is block diagram schematically showing the structure corresponding to one pixel of another photoelectric converter in accordance with the present invention. FIG. 8 is a timing chart showing a detection operation in the photoelectric converter shown in FIG. 7.

As illustrated in FIG. 7, the photosensor in accordance with the present embodiment is characterized in that an electrode of the auxiliary capacitance on the opposite side of the TFT drain of the auxiliary capacitance is driven by a voltage (CS electrode drive voltage 40) which is different from the reference voltage 32, and the CS electrode driving voltage 40 is a binary voltage.

Next, operations of each section of the photosensor of the foregoing structure will be explained in reference to the time chart of FIG. 8. FIG. 8 indicates a time chart of each section in the photosensor in accordance with the present embodiment. In this time chart, it is assumed that before the time t1 in the period 1, the charge is not stored in the auxiliary capacitance 17.

(1) From Time t1 to t5 in the Period 1

At t1 of the period 1, the reset switch 30 of the charge sensitive amplifier 33 is switched from the ON state to the OFF state, and the reset of the charge sensitive amplifier 33 is then cancelled. At t2, when the TFT 7 is turned on with an output of a gate drive signal, the feed-through phenomenon appears, and the charge is transferred from the gate to the drain D and the source S, and by the charge (electron hole) as received, the output from the charge sensitive amplifier 33 is reduced. The foregoing feed-through phenomenon occurs by the following mechanism. That is, in the TFT 7, there exists a part overlapped with a gate at portions between the gate and the drain D and between the gate and the source S, and a parasitic capacitance exists in the overlapped portion (see FIG. 7).

In FIG. 7, the charge sensitive amplifier has such waveform that a value W1 is smaller at and after time t2 than that at t1 due to the feed-through phenomenon. Here, the output from the charge sensitive amplifier 33 is subjected to a delay in fall by the time constant of the data line 23 of the sensor substrate 20.

The output from the low pass filter 34 which receives an output from the charge sensitive amplifier 33 is reduced towards an output value of the charge sensitive amplifier 33 in the period after t2 with a time constant, and is reduced finally to a value W1.

The output from the amplifier 35 which receives an output from the low pass filter 24 is reduced towards an output value×G (gain) of the charge sensitive amplifier 33, and is reduced finally to a value W1×G, and this value W1×G is sampled and held at t3. This value W1×G is a feed-through signal component.

At t4, the reset switch 30 of the charge sensitive amplifier 33 is switched from the OFF state to the ON state, and a feedback capacitance 39 of the charge sensitive amplifier 33 is then shorted. Here, the output from the charge sensitive amplifier 33 becomes a reference value (Vref), and therefore the respective outputs from the low pass filter 34 and the amplifier 35 also become Vref.

At t5, when the Cs electrode driving voltage is ON, the charge (electron hole) is transferred into the drain D of the TFT 7 due to an auxiliary capacitance. In this state, however, as the charge sensitive amplifier 33 is in the reset state, the charge as received disappears.

(2) From Time t6 to t7 in the Period 1

At t6, when the supply of the gate drive signal of the TFT 7 is stopped, the feed-through phenomenon appears mainly due to a parasitic capacitance between the gate and the source S of the TFT 7, and the charge (electrons) is transferred into the feedback capacitance 39 of the charge sensitive amplifier 33. In this state, however, as the charge sensitive amplifier 33 is in the reset state, the charge as received disappears. On the other hand, by the feed-through phenomenon due to the parasitic capacitance between the gate and the drain D of the TFT 7, the charge (electrons) is transferred into the auxiliary capacitance 17, and the TFT drain voltage is reduced by W2.

At t7, when the Cs electrode driving voltage is OFF, the charge (electrons) is transferred into the drain of the TFT 7 due to an auxiliary capacitance, which in turn reduces the output of the charge sensitive amplifier 33 to the value W3.

In this state, by emitting a light beam onto the TFT 7 for a predetermined time, the charge stored in the auxiliary capacitance 17 is transferred to the source side of the TFT 7 by an optical current, and with this transfer of the charge, the drain voltage of the TFT 7 is increased (from t7 in the period 1 to t2 in the period 2). For the TFT 7 without an emission of a light beam, an optical current does not generate, and the charge in the auxiliary capacitance 17 is maintained, and the TFT drain voltage remains unchanged.

(3) From Time t1 to t5 in the Period 2

At t1 of the period 2, the reset switch 30 of the charge sensitive amplifier 33 is switched from the ON state to the OFF state, and the reset of the charge sensitive amplifier 33 is then cancelled. At t2, when the TFT 7 is turned on with an output of a gate drive signal, the feed-through phenomenon appears, and the charge is transferred from the gate to the drain D and the source S, and by the charge (electron hole) as received, the output from the charge sensitive amplifier 33 is reduced. Here, the charge (electrons) as applied to the auxiliary capacitance 17 at t6 and t7 in the period 1 is also transferred to the side of the source S, and the output of the charge sensitive amplifier 33 is increased. In this state, an amount of charge is varied according to an emission of a light beam onto the TFT.

FIG. 8 shows the case in which the entire TFT (pixel) receives light, and the case in which the TFT does not receive light. The difference in amount of charge causes a difference of W4 (t3) between the output of the charge sensitive amplifier of the TFT with an emission of light and the output of the charge sensitive amplifier of the TFT without an emission of light beam. The output from the charge sensitive amplifier 33 is reduced finally to W4×G, and this value is sampled and held at t3. This value as sampled and held indicates a difference between a detection value of a pixel with an emission of a light beam and a detection value of a pixel without an emission of a light beam.

At t4, the reset switch 30 of the charge sensitive amplifier 33 is switched from the OFF state to the ON state, and a feedback capacitance 39 of the charge sensitive amplifier 33 is then shorted. Here, the output from the charge sensitive amplifier 33 becomes a reference value (Vref), and therefore the respective outputs from the low pass filter 34 and the amplifier 35 also become Vref.

Then, with an application of a CS electrode drive voltage at t5, charge (electron hole) is transferred into the drain of the TFT 7. In this state, however, as the charge sensitive amplifier 33 is in the reset state, the charge as received disappears.

(4) From Time t6 to t7 in the Period 2

At t6, when the supply of the gate drive signal is stopped, the feed-through phenomenon appears mainly due to a parasitic capacitance between the gate and the source S of the TFT 7, and the charge (electrons) is transferred into the feedback capacitance 39 of the charge sensitive amplifier 33. In this state, however, as the charge sensitive amplifier 33 is in the reset state, the charge as received disappears. On the other hand, by the feed-through phenomenon due to the parasitic capacitance mainly between the gate and the drain D of the TFT 7, the charge (electrons) is transferred into the auxiliary capacitance 17, and the TFT drain voltage is reduced by W2.

Then, when the Cs electrode driving voltage is OFF at t7, the charge (electrodes) is transferred into the drain of the TFT 7 due to an auxiliary capacitance, which in turn reduces the output of the charge sensitive amplifier 33 to the value W3. In this state, by emitting a light beam onto the TFT 7 for a predetermined time, the charge stored in the auxiliary capacitance 17 is transferred to the source side of the TFT 7 by an optical current, and with this transfer of the charge, the drain voltage of the TFT 7 is increased (at or after t7 in the period 2). For the TFT 7 without an emission of a light beam, an optical current does not generate, and the charge in the auxiliary capacitance 17 is maintained, and the TFT drain voltage remains unchanged.

As described, by performing the operation in the period 1 and the period 2 once, it is possible to detect a photoelectric conversion amount once at t3 in the period 2. Further, by repeating the operations in the period 1 and the period 2, the foregoing detecting operation is repeated, and it is therefore possible to sequentially detect the photoelectric conversion amount at t3 respectively in the period 1 and the period 2.

Figure 9:
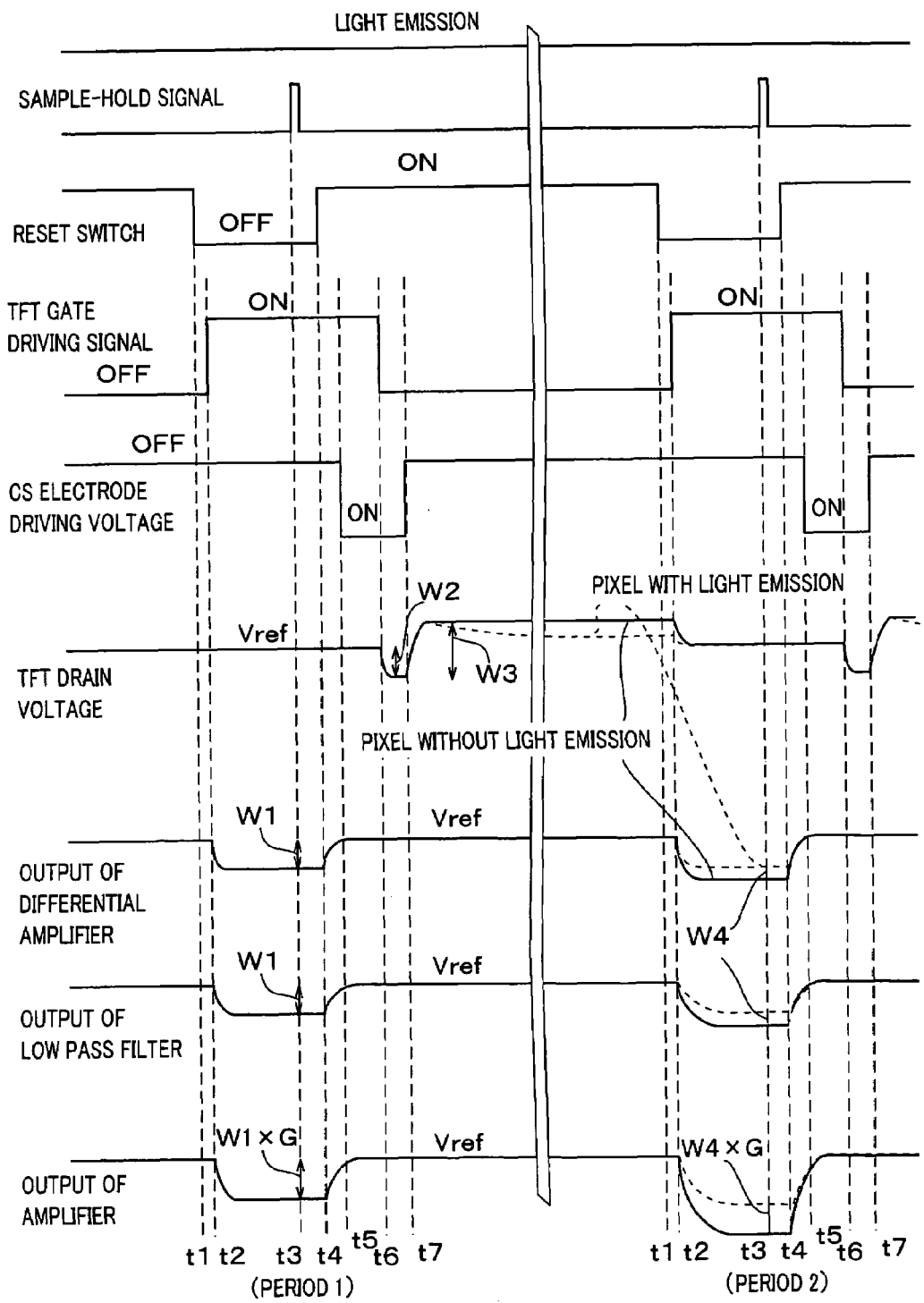
FIG. 9 is a timing chart showing another detecting operation in the photoelectric converter shown in FIG. 7.

According to the present embodiment, as illustrated in FIG. 8, the auxiliary capacitance 17 is charged by setting a CS electrode drive voltage to a high level at t5 and to be switched to a low level at t7. However, it may be arranged as shown in FIG. 9 to charge the auxiliary capacitance 17 by inversely driving, i.e., by setting the CS electrode drive voltage to the low level at t5, and is switched to the high level at t7. However, it should be noted here that in the case of FIG. 9, the auxiliary capacitance 17 is charged in reverse polarity to that of the feed-through signal component resulting from the stoppage of the supply of the gate signal at t6, resulting in a smaller amount of charge stored in the auxiliary capacitance 17 as compared to the case of FIG. 8.

Third Embodiment

A still another embodiment of the present invention will be explained. For convenience in explanations, members having the same functions as those of the second embodiment will be designated by the same reference numerals, and thus the descriptions thereof shall be omitted here. The same structures shown in FIG. 5 and FIG. 6 are adopted in the present embodiment.

Figure 10:
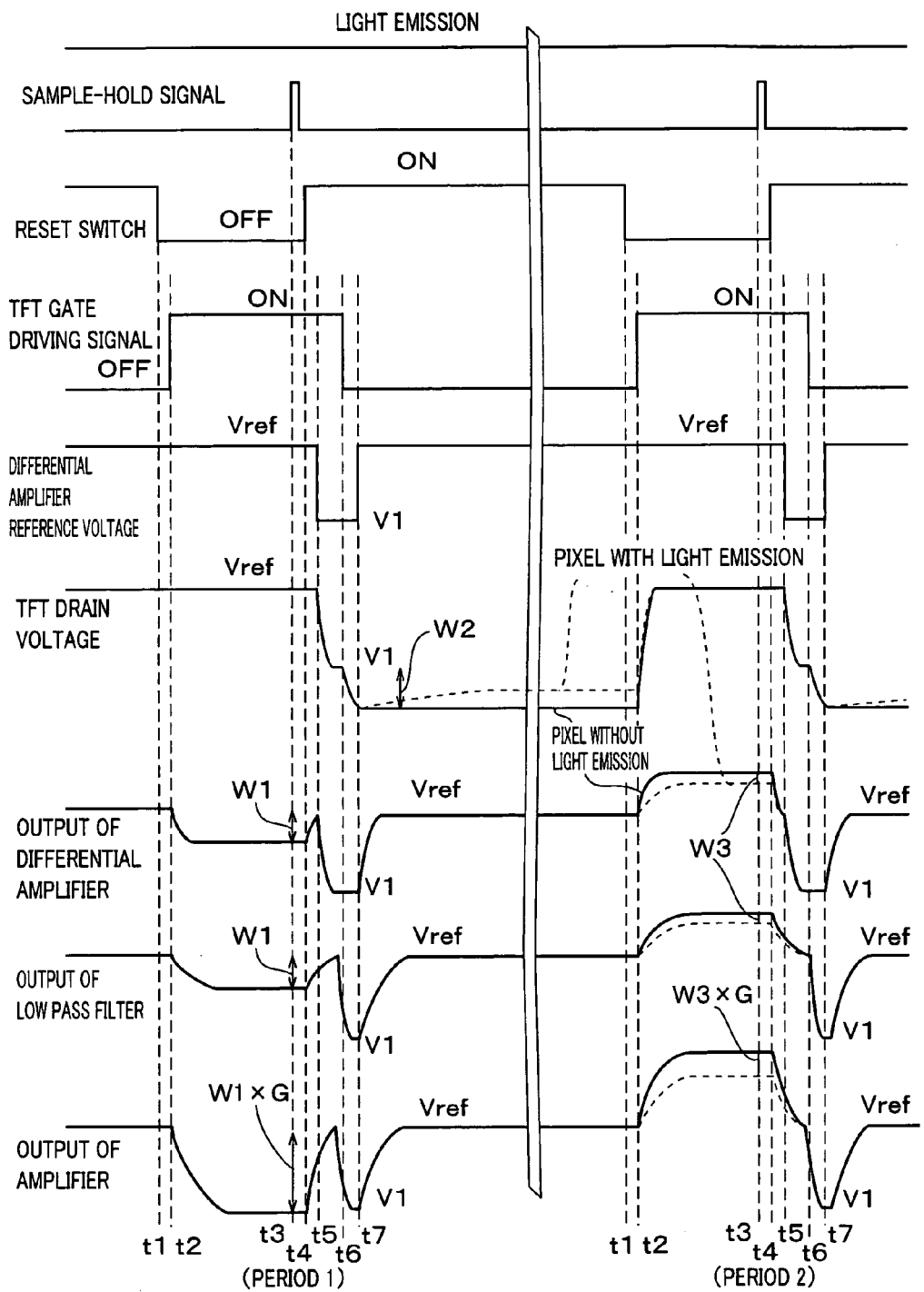
FIG. 10 is a timing chart showing still another detecting operation in the photoelectric converter shown in FIG. 7.

The structure and the operation of the photosensor in accordance with the present embodiment will be explained in reference to FIG. 7 and FIG. 10. FIG. 10 is a timing chart showing a detection operation in the photoelectric converter shown in FIG. 7.

As illustrated in FIG. 7, the photosensor in accordance with the present embodiment is characterized in that an electrode of the auxiliary capacitance on the opposite side of the TFT drain of the auxiliary capacitance is driven by a voltage (CS electrode drive voltage 40) which is different from the reference voltage 23. Other than the foregoing, the structure of the photosensor shown in FIG. 7 is the same as the structure of the photosensor shown in FIG. 1. The structure of the present embodiment differs from that of the second embodiment in that the reference voltage 32 shown FIG. 7 is a binary voltage, and the CS electrode drive voltage 40 is constant.

Next, operations of each section of the photosensor of the foregoing structure will be explained in reference to the time chart of FIG. 10. FIG. 10 indicates a time chart of each section in the photosensor in accordance with the present embodiment. In this time chart, it is assumed that before the time t1 in the period 1, the charge is not stored in the auxiliary capacitance 17.

(1) From Time t1 to t5 in the Period 1

At t1 of the period 1, the reset switch 30 of the charge sensitive amplifier 33 is switched from the ON state to the OFF state, and the reset of the charge sensitive amplifier 33 is then cancelled. At t2, when the TFT 7 is turned on with an output of a gate drive signal, the feed-through phenomenon appears, and the charge is transferred from the gate to the drain D and the source S, and by the charge (electron hole) as received, the output from the charge sensitive amplifier 33 is reduced. The foregoing feed-through phenomenon occurs by the following mechanism. That is, in the TFT 7, there exists a part overlapped with a gate at portions between the gate and the drain D and between the gate and the source S, and a parasitic capacitance exists in the overlapped portion (see FIG. 7).

In FIG. 7, the charge sensitive amplifier has such waveform that a value W1 is smaller at and after time t2 than that at t1 due to the feed-through phenomenon. Here, the output from the charge sensitive amplifier 33 is subjected to a delay in fall by the time constant of the data line 23 of the sensor substrate 20.

The output from the low pass filter 34 which receives an output from the charge sensitive amplifier 33 is reduced towards an output value of the charge sensitive amplifier 33 in the period after t2 with a time constant, and is reduced finally to a value W1.

The output from the amplifier 35 which receives an output from the low pass filter 24 is reduced towards an output value×G (gain) of the charge sensitive amplifier 33, and is reduced finally to a value W1×G, and this value W1×G is sampled and held at t3. This value W1×G is a feed-through signal component.

At t4 of the period 1, the reset switch 30 of the charge sensitive amplifier 33 is switched from the OFF state to the ON state, and a feedback capacitance 39 of the charge sensitive amplifier 33 is then shorted. Here, the output from the charge sensitive amplifier 33 becomes a reference value (Vref), and therefore the respective outputs from the low pass filter 34 and the amplifier 35 also become Vref.

At t5, by the Vref as output, when the reference voltage 32 is set to V1, the voltage of TFT drain, and respective outputs of the charge sensitive amplifier 33, the low pass filter 34 and the amplifier also become V1.

(2) From Time t6 to t7 in the Period 1

At t6, when the supply of the gate drive signal of the TFT 7 is stopped, the feed-through phenomenon appears mainly due to a parasitic capacitance between the gate and the source S of the TFT 7, and the charge (electrons) is transferred into the feedback capacitance 39 of the charge sensitive amplifier 33. In this state, however, as the charge sensitive amplifier 33 is in the reset state, the charge as received disappears. On the other hand, by the feed-through phenomenon due to the parasitic capacitance mainly between the gate and the drain D of the TFT 7, the charge (electrons) is transferred into the auxiliary capacitance 17, and the TFT drain voltage is reduced by W2. In this state, the auxiliary capacitance 17 is charged by the voltage V1+W2.

At t7, by the V1, when the reference voltage 32 is set to Vref, the voltage of TFT drain, and respective outputs of the charge sensitive amplifier 33, the low pass filter 34 and the amplifier also become Vref.

In this state, by emitting a light beam onto the TFT 7 for a predetermined time, the stored in the auxiliary capacitance 17 is transferred to the source side of the TFT 7 by an optical current, and with transfer of the charge, the drain voltage of the TFT 7 is increased (t6 in the period 1 to t2 in the period 2). For the TFT 7 without an emission of a light beam, an optical current does not generate, and the charge in the auxiliary capacitance 17 is maintained, and the TFT drain voltage remains unchanged.

(3) From Time t1 to t5 in the Period 2

At t1 of the period 2, the reset switch 30 of the charge sensitive amplifier 33 is switched from the ON state to the OFF state, and the reset of the charge sensitive amplifier 33 is then cancelled. At t2, when the TFT 7 is turned on with an output of a gate drive signal, the feed-through phenomenon appears, and the charge is transferred from the gate to the drain D and the source S, and by the charge (electron hole) as received, the output from the charge sensitive amplifier 33 is reduced. Here, the charge (electrons) as applied to the auxiliary capacitance 17 at t5 and t6 in the period 1 is also transferred to the side of the source S, and the output of the charge sensitive amplifier 33 is increased. In this state, an amount of charge is varied according to an emission of a light beam onto the TFT.

FIG. 10 shows the case in which the entire TFT (pixel) receives light, and the case in which the TFT does not receive light. The difference in amount of charge causes a difference of W3 (t3) between the output of the charge sensitive amplifier of the TFT with an emission of light and the output of the charge sensitive amplifier of the TFT without an emission of light beam. The output from the charge sensitive amplifier 33 is reduced finally to W3×G, and this value is sampled and held at t3. This value as sampled and held indicates a difference between a detection value of a pixel with an emission of a light beam and a detection value of a pixel without an emission of a light beam.

At t4 of the period 1, the reset switch 30 of the charge sensitive amplifier 33 is switched from the OFF state to the ON state, and a feedback capacitance 39 of the charge sensitive amplifier 33 is then shorted. Here, the output from the charge sensitive amplifier 33 becomes a reference value (Vref), and therefore the respective outputs from the low pass filter 34 and the amplifier 35 also become Vref.

At t5, by the Vref as output, when the reference voltage 32 is set to V1, the voltage of TFT drain, and respective outputs of the charge sensitive amplifier 33, the low pass filter 34 and the amplifier also become V1.

(3) From Time t6 to t7 in the Period 2

At t6, when the supply of the gate drive signal of the TFT 7 is stopped, the feed-through phenomenon appears mainly due to a parasitic capacitance between the gate and the source S of the TFT 7, and the charge (electrons) is transferred into the feedback capacitance 39 of the charge sensitive amplifier 33. In this state, however, as the charge sensitive amplifier 33 is in the reset state, the charge as received disappears. On the other hand, by the feed-through phenomenon due to the parasitic capacitance mainly between the gate and the drain D of the TFT 7, the charge (electrons) is transferred into the auxiliary capacitance 17, and the TFT drain voltage is reduced by W2. In this state, the auxiliary capacitance 17 is charged by the voltage V1+W2.

At t7, by the V1, when the reference voltage 32 is set to Vref, the voltage of TFT drain, and respective outputs of the charge sensitive amplifier 33, the low pass filter 34 and the amplifier also become Vref.

In this state, with an emission of a light beam onto the TFT 7 for a predetermined time, the charge stored in the auxiliary capacitance 17 is transferred to the source side of the TFT 7 by an optical current, and with this transfer of the charge, the drain voltage of the TFT 7 is increased (t6 in the period 1 to t2 in the period 2). For the TFT 7 without an emission of a light beam, an optical current does not generate, and the charge in the auxiliary capacitance 17 is maintained, and the TFT drain voltage remains unchanged.

As described, by performing the operation in the period 1 and the period 2 once, it is possible to detect a photoelectric conversion amount once in at t3 in the period 2. Further, by repeating the operations in the period 1 and the period 2, the foregoing detecting operation is repeated, and it is therefore possible to sequentially detect the photoelectric conversion amount at t3 respectively in the period 1 and the period 2.

Figure 11:
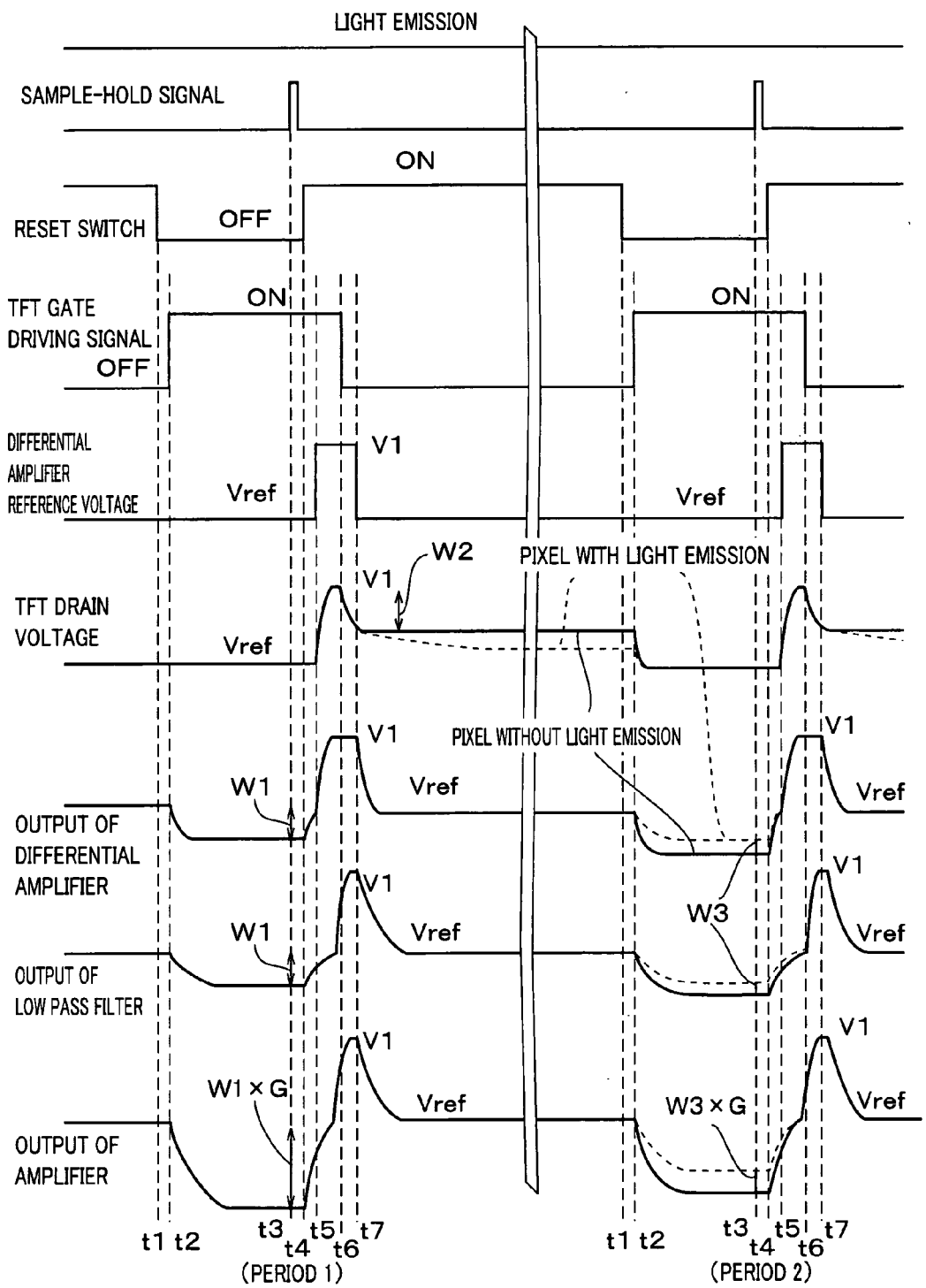
FIG. 11 is a timing chart showing yet still another detecting operation in the photoelectric converter shown in FIG. 7.

According to the present embodiment, as illustrated in FIG. 10, the auxiliary capacitance 17 is charged by setting the reference voltage to V1 (low level) at t5 and to be switched to Vref (high level) at t7. However, it may be arranged as shown in FIG. 11 to charge the auxiliary capacitance 17 by inversely driving, i.e., by setting the reference voltage to V1 (high level) at t5 and to be switched to Vref (low level) at t7. However, it should be noted here that in the case of FIG. 11, the auxiliary capacitance 17 is charged in reverse polarity to that of the feed-through signal component resulting from the stoppage of the supply of the gate signal at t6, resulting in a smaller amount of charge stored in the auxiliary capacitance 17 as compared to the case of FIG. 10.

Figure 12:
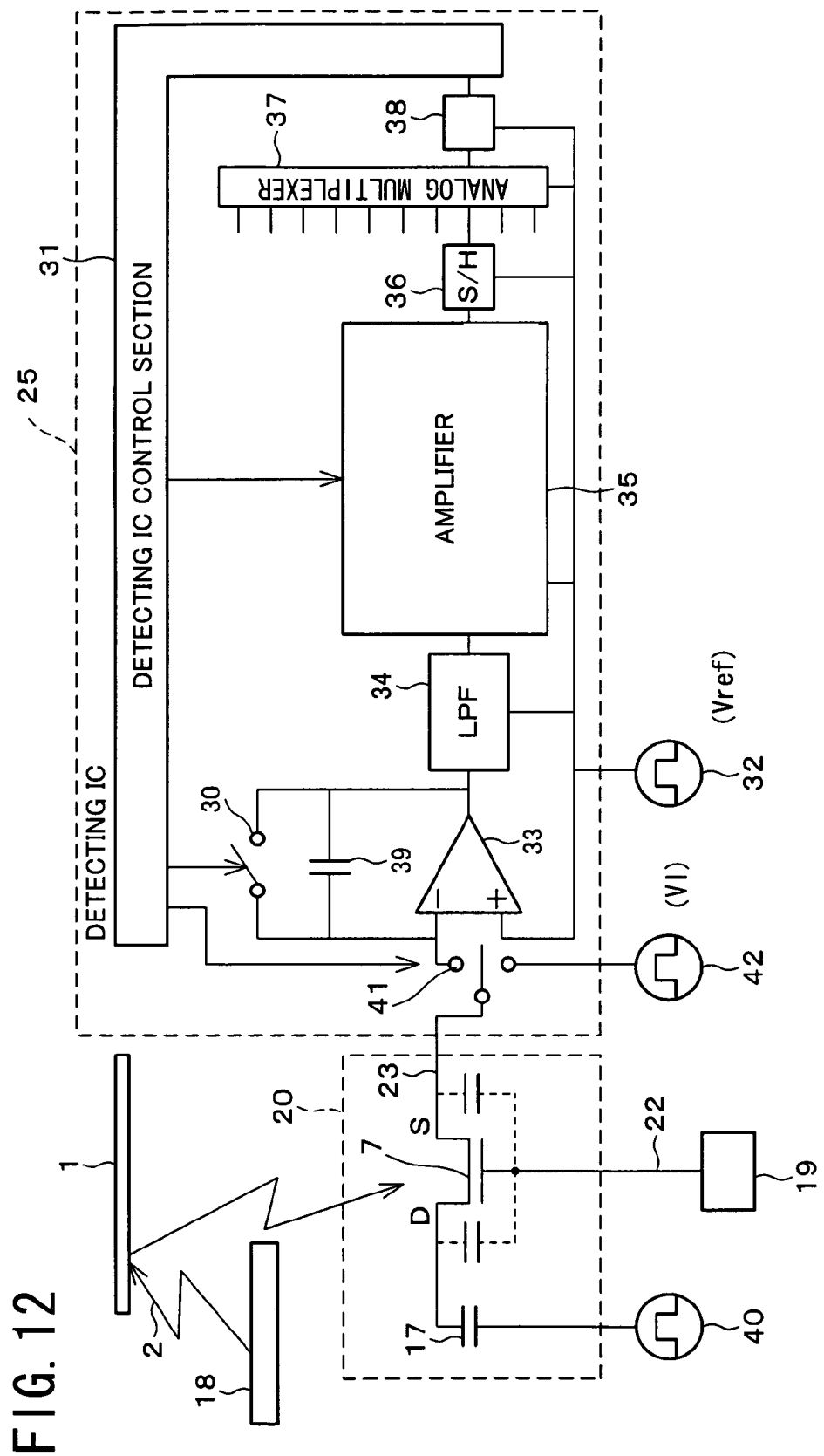
FIG. 12 is a block diagram schematically showing the structure corresponding to one pixel of still another photoelectric converter in accordance with the present invention.

According to the present embodiment, in the block diagram of FIG. 7, a binary voltage is adopted for the reference voltage; however, the same functions can be achieved from the structure shown in the block diagram of FIG. 12, i.e., the reference voltage is set to be constant, and the reference voltage 32 and the charge voltage 42 are switched by the switch 41.

Fourth Embodiment

A still another Embodiment of the present invention will be explained. For convenience in explanations, members having the same functions as those of the second embodiment will be designated by the same reference numerals, and thus the descriptions thereof shall be omitted here. The same structures shown in FIG. 1, FIG. 5 and FIG. 6 are adopted in the present embodiment. In the following, explanations will be given through the case where the auxiliary capacitance 17 is charged by the method as explained in the first embodiment; however, the methods as explained in the second embodiment and the third embodiment may be equally adopted.

In the present embodiment, the structure of controlling ON/OFF of a light beam to be emitted onto the photosensor (the photoelectric converter) including a plurality of sensor pixels arranged in a matrix form (or in 1D) shown in the block diagram of FIG. 1 adopted in the first embodiment. Other than the foregoing, the structure of the present embodiment is the same as that of FIG. 1. Incidentally, in the case of adopting the method of the second embodiment or the third embodiment, the structure of the present invention is the same as that of FIG. 7 or FIG. 12, other than that with or without an emission of a light beam to the photosensor is controlled.

Figure 13:
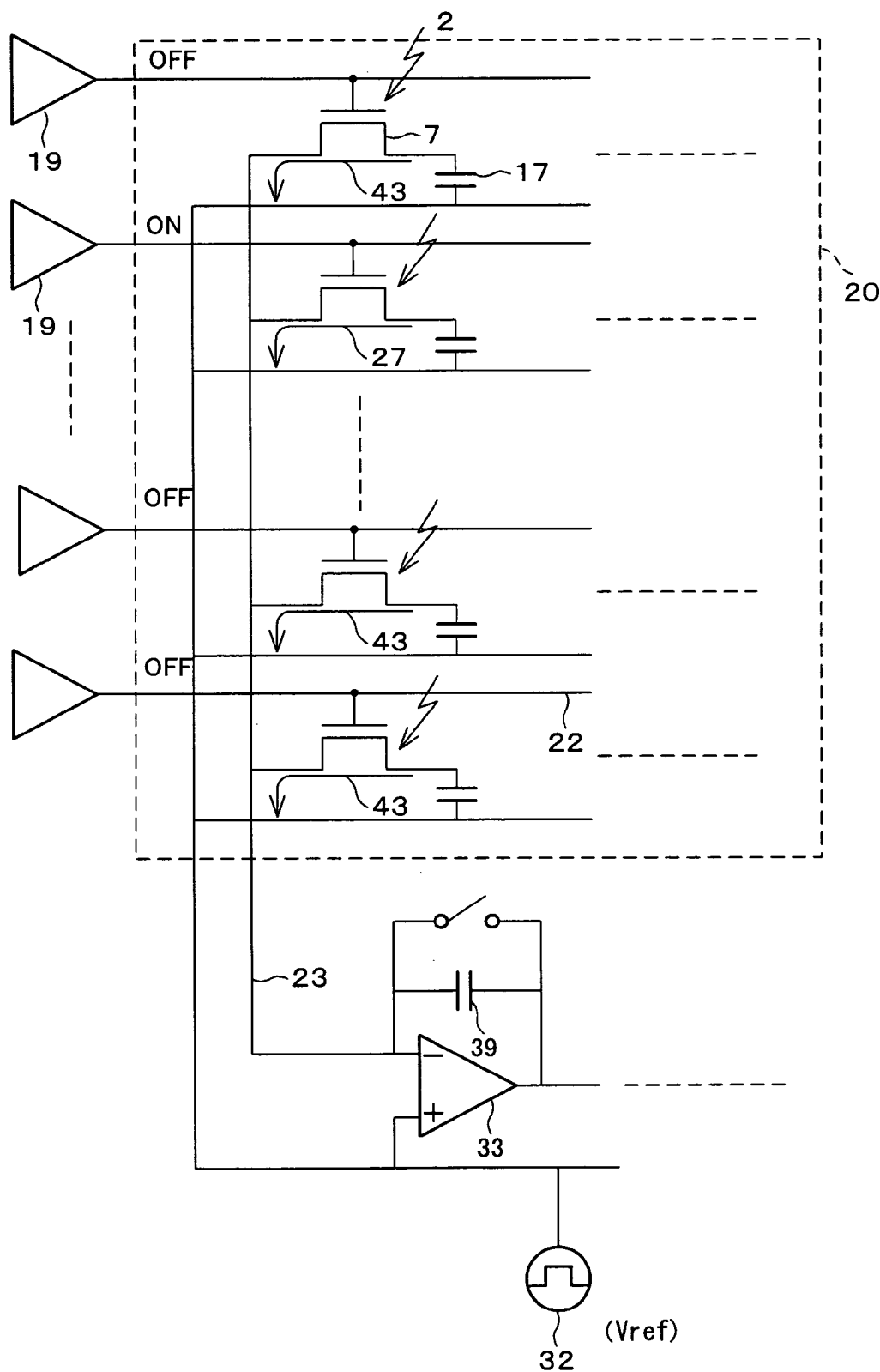
FIG. 13 is an equivalent circuit diagram for one data line of the photoelectric converter of the present invention.

FIG. 13 is an equivalent circuit diagram for one data line of the two-dimensional sensor of FIG. 5. In the structure shown in FIG. 13, the number of pixels (TFTs 7) connected to the data line 23 is in the number of some hundreds to some thousands. In the present embodiment, the detection of the amount of charge and photoelectric conversion amount is performed with respect to these pixels at a timing shown in FIG. 2 of the first embodiment.

Specifically, in FIG. 13, the charge (the charge 27 as read), which is stored in the auxiliary capacitance 17 of the TFT 7 connected to the gate line 22 in the ON state, among gate lines 22 which sequentially scan pixels in the number of some hundreds to some thousands by the driving ICs 19, indicates a photoelectric conversion amount. Other TFTs 7 are in the OFF state as being connected to the gate line 22 in the OFF state. However, as a light beam is emitted onto these TFTs 7, a small amount of optical current 43 is leaked from the corresponding auxiliary capacitances 17 to the data lines 23.

The charge generated by the optical current 43 is stored in the feedback capacitance 39 of the charge sensitive amplifier 33 of FIG. 1 in the period from t1 to t3 of FIG. 2. Here, although an amount of optical current 43 in each pixel is small, as the number of pixels in which the optical current 43 is large, i.e., some hundreds to some thousands, the charge as stored in the feedback capacitance 39 may cause an error (crosstalk) with respect to the charge 27 as read.

Figure 14:
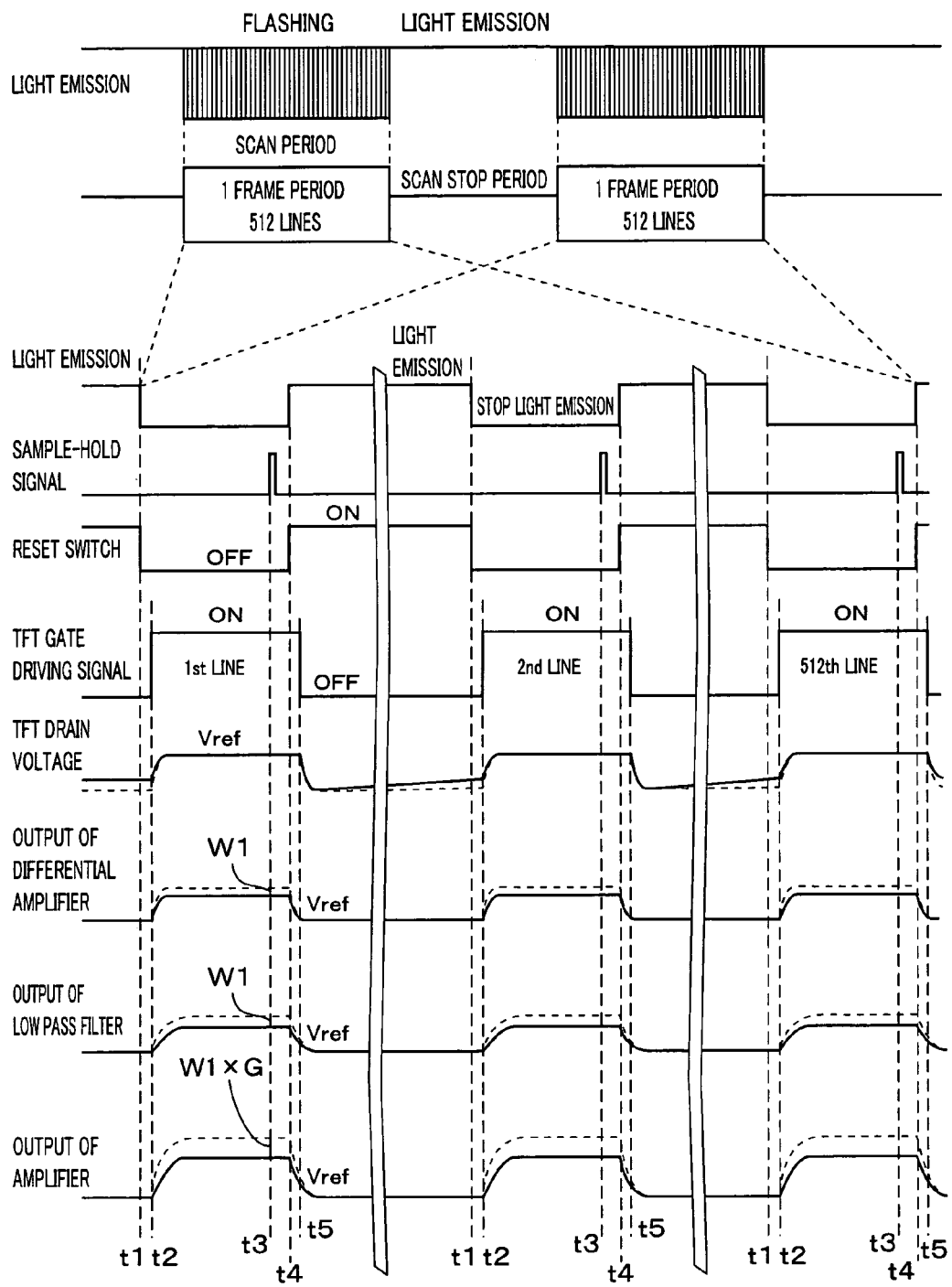
FIG. 14 is a timing chart showing a detecting operation for preventing a crosstalk in the photoelectric converter of the present invention.
Figure 15:
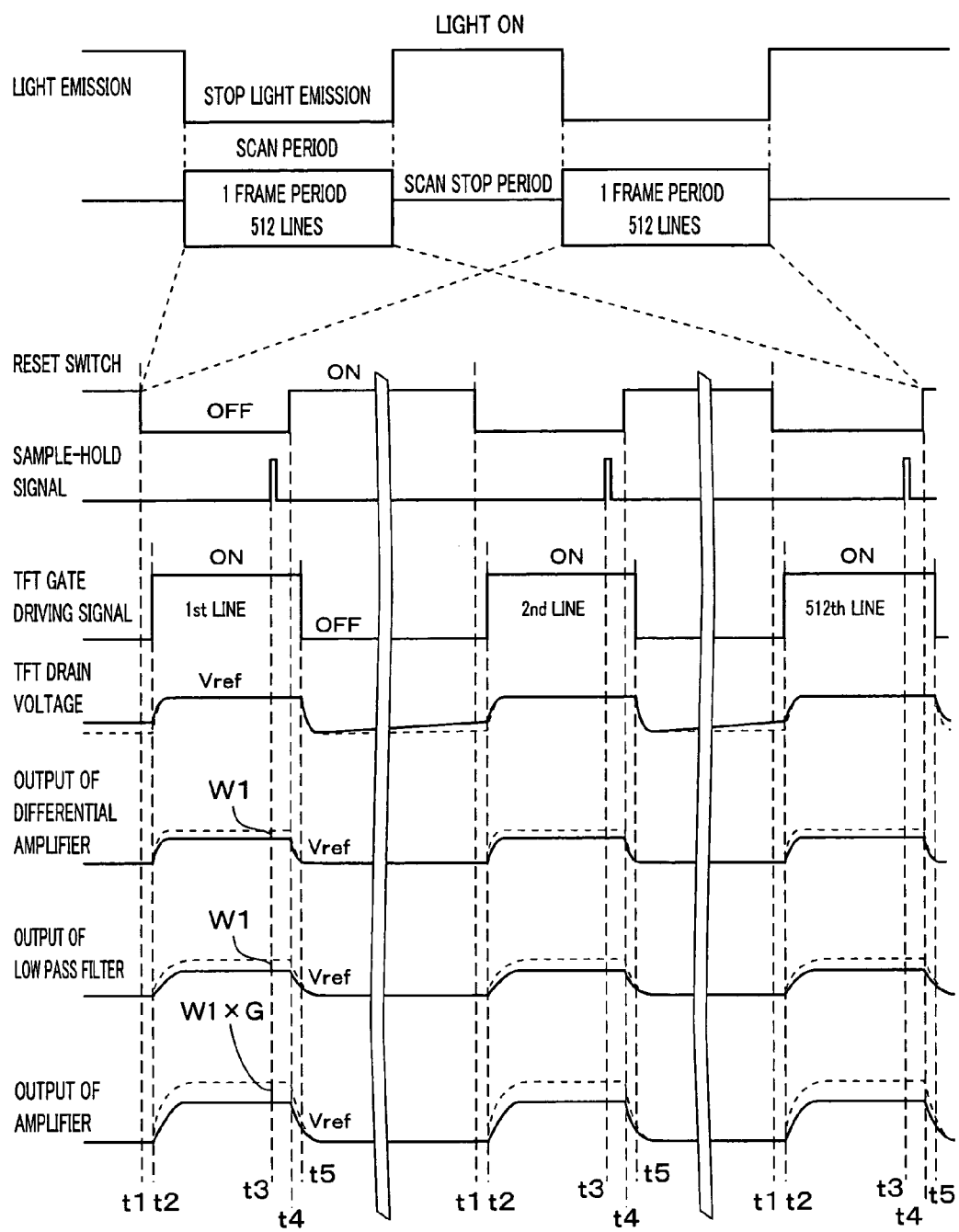
FIG. 15 is a timing chart showing another detecting operation for preventing a crosstalk in the photoelectric converter of the present invention.

In response, to prevent the optical current 43 which can be the case of the error (crosstalk), the driving is performed at a timing shown in FIG. 14 and FIG. 15. In FIG. 14 and FIG. 15, an interval is referred to as a frame, and each frame corresponds to 512 lines (the number of pixels in the data signal line direction is 512).

When driving at a timing indicated in FIG. 14, in the period from t1 to t4, i.e., the charge reading period, an emission of a light beam is stopped. In this way, an optical current 43 other than the charge 27 to be read does not flow, and charge can be prevented from being leaked, and an occurrence of an error (crosstalk) can therefore be prevented.

Incidentally, when driving at a timing shown in FIG. 15, an emission of a light beam is stopped during the scanning period of one frame. In this way, an optical current 43 other than the charge 27 as read does not flow, and the charge can be prevented from being leaked, and an occurrence of an error can therefore be prevented.

Fifth Embodiment

A still another embodiment of the present invention will be explained. For convenience in explanations, members having the same functions as those of the second embodiment will be designated by the same reference numerals, and thus the descriptions thereof shall be omitted here. The same structures shown in FIG. 1, FIG. 5 and FIG. 6 are adopted in the present embodiment. In the following, explanations will be given through the case where the auxiliary capacitance 17 is charged by the method as explained in the first embodiment; however, the methods as explained in the second embodiment and the third embodiment may be equally adopted.

In the present embodiment, explanations will be given through the case of reading a color document by emitting a red light beam in red, a green light beam, and a blue light beam in this order in the photosensor shown in FIG. 1. Other than the foregoing, the structure of the present embodiment is the same as that of FIG. 1. Incidentally, in the case of adopting the method of the second embodiment or the third embodiment, the structure of the present invention is the same as that of FIG. 7 or FIG. 12.

Figure 16:
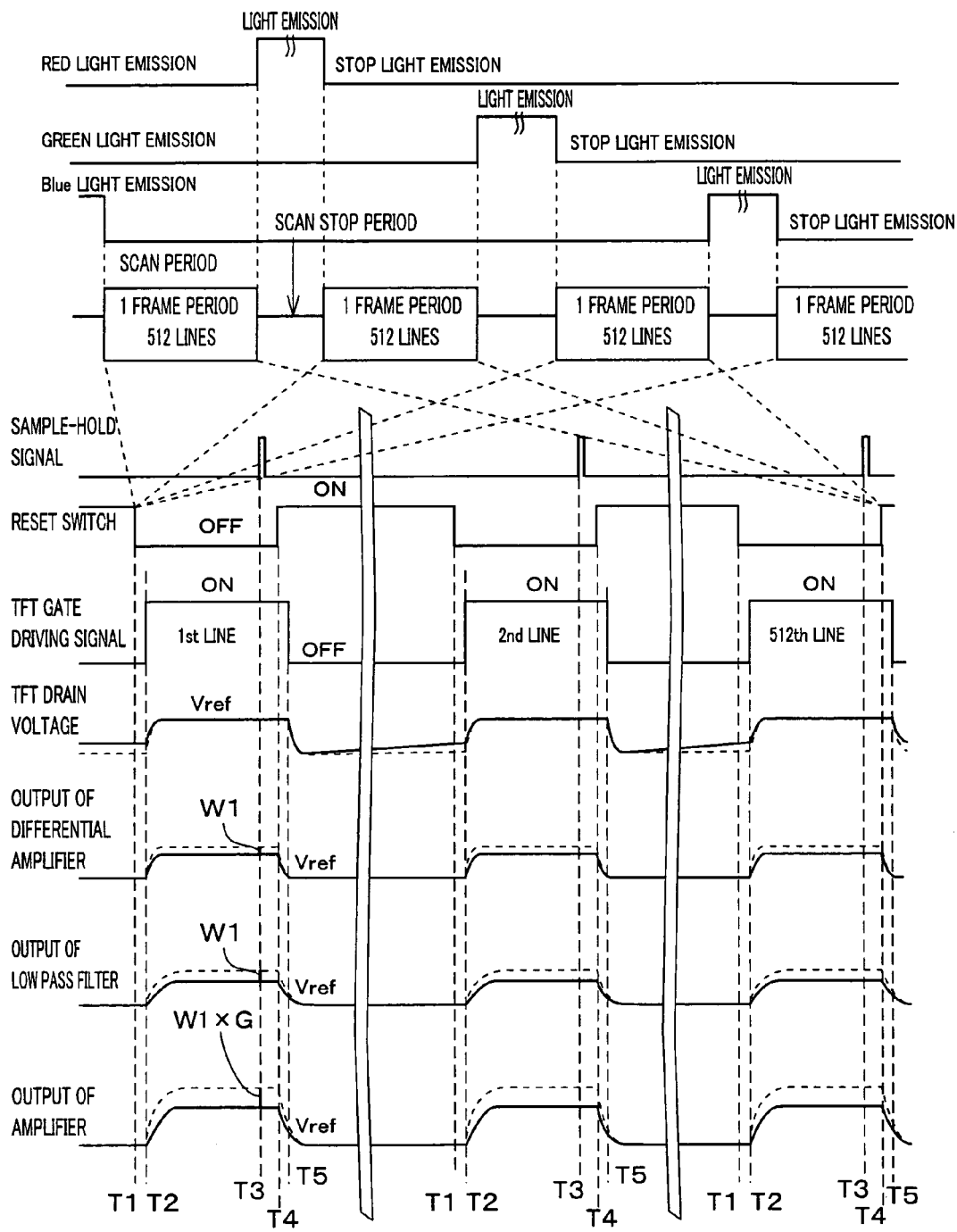
FIG. 16 is a timing chart in the case of obtaining a color image in the photoelectric converter of the present invention.

In the photosensor shown in FIG. 1, at a timing shown in FIG. 16, a red light beam, a green light beam, and a blue light beam are emitted in this order, to obtain pixel data corresponding to the respective color light beams. Then, by compositing respective data corresponding to the light beams in red, green and blue respectively, a color image can be obtained. Further, by repeating the operation performed at the timing of FIG. 16, it is possible to obtain a continuous color image.

In each of the foregoing preferred embodiments, explanations have been given through the case where the photoelectric converter serves not only as a photosensor but also as a member for selecting pixel. However, the present invention is not intended to be limited to the foregoing structure, the function as a photosensor and the function to select pixel may be realized by different TFTs. Any of the driving methods explained in the first through fifth embodiment can equally be equally applied to the structure of adopting two TFTs.

Figure 17:
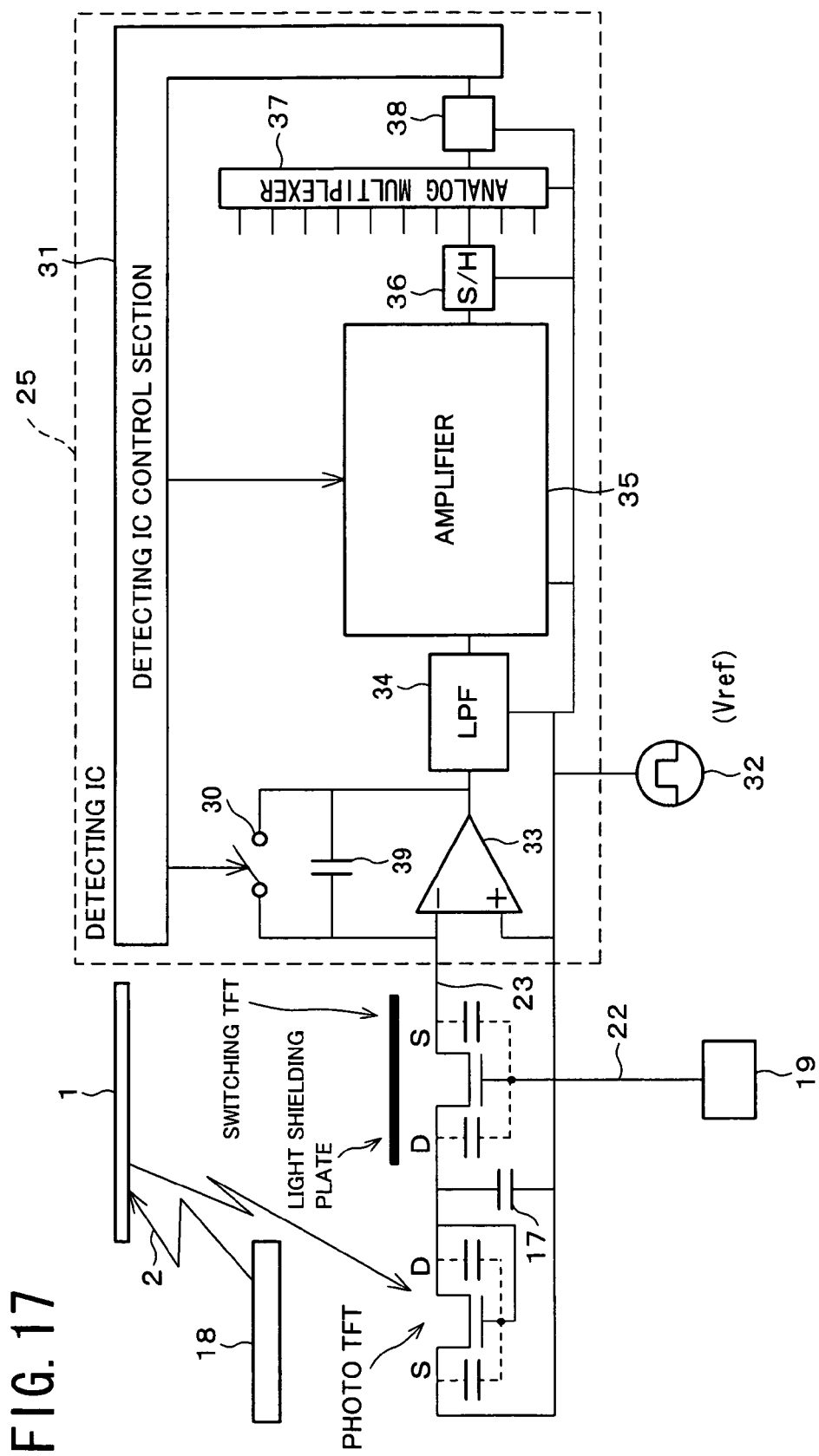
FIG. 17 is a block diagram schematically showing the structure corresponding to one pixel of still another photoelectric converter in accordance with the present invention.

Specifically, for example, as illustrated in FIG. 17, a photo TFT which serves as a photosensor, and a switching TFT which realizes the function of selecting pixels may be provided. In this case, the photosensor TFT is to be functioned in the same manner as the TFT 7 adopted in each of the foregoing embodiments. In the structure of FIG. 17, a light shielding plate is formed at above the switching TFT, to prevent a generation of an excessive optical current.

Figure 18:
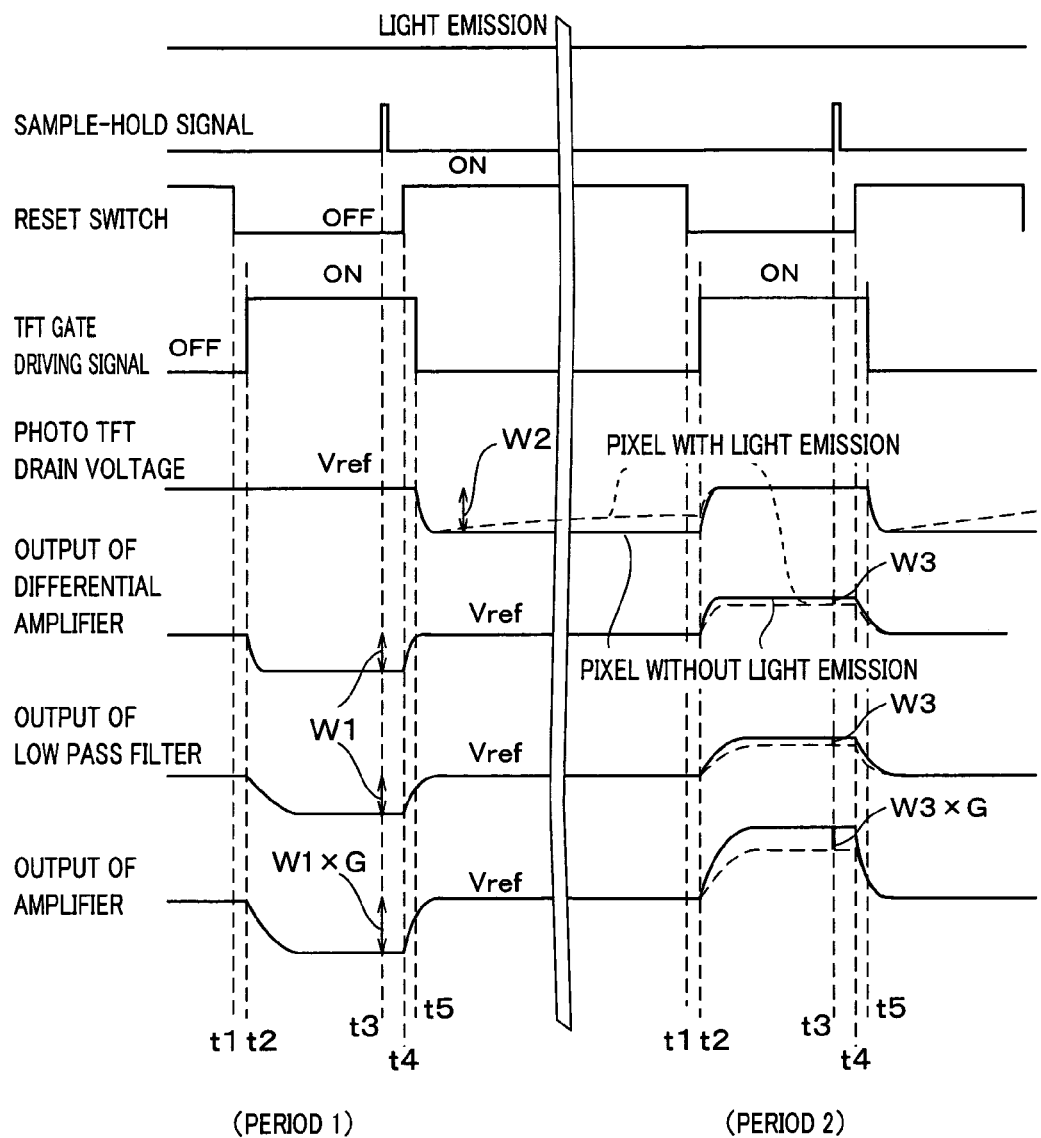
FIG. 18 is a timing chart showing a detecting operation in the photoelectric converter shown in FIG. 17.

The photoelectric converter shown in FIG. 17 performs a detecting operation as shown in the timing chart of FIG. 18. The timing chart of FIG. 18 is basically the same as the timing chart of FIG. 2, except that "the voltage of the TFT drain" is replaced with "the voltage of the photo TFT drain".

Therefore, the present embodiment can be applied to not only the photoelectric converter shown in FIG. 1 but also to the photoelectric converter shown in FIG. 7. In the case where the present embodiment is applied to the photoelectric converter shown in FIG. 7, the detection operation can be performed at the same timing only by replacing "the voltage of the TFT drain" in the timing charts of FIG. 8 through FIG. 11 with "the voltage of the photo TFT drain.

Needless to mention, the present invention is also applicable to the photoelectric converter shown in FIG. 12, and to the photoelectric converters adopted in the fourth and fifth embodiments.

As described, the photoelectric converter of the present invention is characterized in that the photosensor itself functions not only as a photosensor but also to select pixel, and that the photoelectric conversion amount is detected based on the amount of charge obtained by deducting from the predetermined amount of charge stored in the auxiliary capacitance 17, the amount of charge released therefrom which corresponds to the optical current.

According to the photoelectric converter of the foregoing structure, it is possible to realize a high density pixel by reducing the size of the photosensor section, and also possible to realize a photosensor of a simple structure. Moreover, the photoelectric converter of a large dynamic range can be obtained.

The photoelectric converter of the present invention may be characterized in that the predetermined amount of charge is stored in the auxiliary capacitance 17 by utilizing a gate driving signal of the TFT 7. With this structure, it is possible to realize a photosensor that can be driven at simple timing without requiring a complicated structure.

The photoelectric converter of the present invention may be characterized in that the predetermined amount of charge is stored in the auxiliary capacitance 17 by utilizing a CS electrode driving voltage 40. With this structure, it is possible to realize a photosensor that can be driven at simple timing without requiring a complicated structure, and which can realize a large dynamic range.

The photoelectric converter of the present invention may be characterized in that the predetermined amount of charge is stored in the auxiliary capacitance 17 by utilizing an external circuit connected to the data line 23. With this structure, it is possible to realize a photosensor that can be driven at simple timing without requiring a complicated structure, and which can realize a large dynamic range.

The photoelectric converter of the present invention may be characterized in that an emission of a light beam is stopped while detecting by the detecting IC 25, the amount of charge remaining in the auxiliary capacitance 17. With this structure, it is possible to prevent a crosstalk in the direction of the data line 23 without hardly reducing the light beam emission time onto the TFT 7.

The photoelectric converter of the present invention may be characterized in that an emission of a light beam is stopped during one frame period in which the amount of charge remaining in the auxiliary capacitance 17 is being detected by the detecting IC 25. With this structure, it is possible to prevent a crosstalk in the direction of the data line 23, at a simple driving timing with respect to the back light unit 18.

The photoelectric converter of the present invention may be characterized in that a red light beam, a green light beam and a blue light beam are omitted to obtain pixel data corresponding to respective colors. With this structure, by compositing data respectively corresponding to the red light beam, the green light beam and the blue light beam, it is possible to realize a photosensor which permits a color image to be obtained.

The photoelectric converter of the present invention is applicable to not only the 2D image sensor but also 1D image sensor.

The photoelectric converter of the present invention is also applicable to PDA (Personal Digital Associates). In this case, by proving the 2D image sensor of the present invention on the surface on the opposite side of the display screen of the PDA, it is possible to obtain the document without treatment or apply an enlarged display for a prescribed part of the document.

The photoelectric converters of the present invention is characterized by including a plurality of photoelectric conversion elements, each being made up of at least a gate electrode, a source electrode, a drain electrode, a gate insulating film and a photosensitive semiconductor layer; auxiliary capacitance connected to the drain electrode of the thin film transistor; and photoelectric conversion amount detection means connected to the source electrode, wherein a predetermined amount of charge is stored in the auxiliary capacitance in the conductive state of the thin film transistor, and after the predetermined amount of charge is stored, the thin film transistor is set in the non-conductive state in the predetermined time by emitting a light beam, and the thin film transistor is then set in the conductive state after the predetermined time, and the amount of photoelectric conversion is detected by the photoelectric conversion amount detection means.

The photoelectric converter of the present invention is characterized by including a plurality of photoelectric conversion elements, each being made up of at least a gate electrode, a source electrode, a drain electrode, a gate insulating film and a photosensitive semiconductor layer; auxiliary capacitance connected to the drain electrode of the thin film transistor; and photoelectric conversion amount detection means connected to the source electrode, wherein the photoelectric conversion amount is detected by the photoelectric conversion amount detection means in the conductive state of the thin film transistor, and after detecting the photoelectric conversion amount, a predetermined amount of charge is stored in the auxiliary capacitance, and the thin film transistor is set in the non-conductive state in the predetermined period while emitting a light beam after storing the predetermined amount of charge in the auxiliary capacitance. With this structure, by repeating the operation in the conductive state of the thin film transistor and the operation in the non-conductive state of the thin film transistor after the predetermined time, it is possible to successively detect the photoelectric conversion amount.

The photoelectric converter of the present invention may be characterized in that the predetermine amount of charge is stored in the auxiliary capacitance by utilizing the charge injection by the gate electrode driving voltage.

The photoelectric converter of the present invention may be characterized in that the predetermine amount of charge is stored in the auxiliary capacitance by changing the voltage to be applied to one of electrodes of the auxiliary capacitance, formed on an opposite side of the one connected to the drain electrode of the thin film transistor.

The photoelectric converter of the present invention may be characterized in that the predetermined amount of charge is stored in the auxiliary capacitance by applying a predetermined voltage by an external circuit connected to the source electrode of the thin film transistor.

The photoelectric converter of the present invention may be characterized in that the charge to be released from the source electrode of the thin film transistor by emitting a light beam is erased by the external circuit in the non-conductive state of the thin film transistor.

The photoelectric converter of the present invention may be characterized in that the thin film transistor is set in the conductive state, and an emission of a light beam onto the thin film transistor is stopped while detecting the photoelectric conversion amount by the photoelectric conversion amount detection means.

The photoelectric converter of the present invention may be characterized in that a red light beam, a green light beam and a blue light beam are emitted to detect photoelectric conversion amounts for respective color light beams, and a color image is obtained based on the photoelectric conversion amounts as detected.

The two dimensional image sensor of the present invention is characterized by including a plurality of data lines; a plurality of scanning lines, a plurality of thin film transistors, each including a photosensitive semiconductor layer provide at intersections between the data lines and the scanning lines; auxiliary capacitances connected to respective thin film transistors; a signal detecting circuit connected to the data lines; a scanning line driving circuit for supplying a scanning signal to the scanning lines; auxiliary capacitance charge means for storing a predetermined amount of charge in the auxiliary capacitance and the data line driving means for storing a predetermined potential in the data line.

The two-dimensional image sensor of the present invention may be characterized in that after all the auxiliary capacitances have been charged by the auxiliary capacitance charge means, the thin film transistors are set in the conductive state in order by the scanning line driving circuit after a prescribed time, and the amount of charge to be input to the signal detecting circuit from the auxiliary capacitance via the data line is detected.

The two-dimensional image sensor may be arranged such that the plurality of data lines, the plurality of scanning lines, the thin film transistors, each including a photosensitive semiconductor layer, and the plurality of auxiliary capacitances connected to the thin film transistors are formed on a transparent substrate.

The two-dimensional image sensor of the foregoing structure may be characterized in that a transparent protective layer is formed on the surface of transparent substrate on the side the thin film transistors are formed.

The two-dimensional image sensor of the foregoing structure may be characterized in that a back light is formed on the surface of the transparent substrate on the side opposite to the side the thin film transistors are formed.

The two-dimensional image sensor of the foregoing structure may be characterized by including a back light and back light control means wherein after all the auxiliary capacitances have been charged by the auxiliary capacitance charge means, the back light is set in the ON state for a predetermined time, and the thin film transistors are set in the conductive state in order by the scanning line driving circuit after the back light is turned OFF to detect the amount of charge to be input to the signal detecting circuit from the auxiliary capacitances via the data line.

As described, the method of detecting a photoelectric conversion amount of the present invention, for detecting a photoelectric conversion amount of a photoelectric converter which comprises a thin film transistor including a photosensitive semiconductor layer is characterized by comprising the steps of:

(1) storing a predetermined amount of charge in an auxiliary capacitance connected to a drain electrode of the thin film transistor;

(2) emitting a light beam onto the photosensitive semiconductor layer for a predetermined time in a non-conductive state of the thin film transistor after carrying out the step (1); and (3) detecting the photoelectric conversion amount that is an amount of an optical current as converted by the photoelectric converter, based on an amount of charge remaining in the auxiliary capacitance after the step (2).

According to the foregoing structure, by storing the predetermined amount of charge beforehand in the auxiliary capacitance, a photoelectric conversion amount can be detected based on the amount of charge remaining in the auxiliary capacitance after releasing therefrom the charge by emitting a light beam.

As described, by detecting the amount of charge remaining in the auxiliary capacitance, the photoelectric conversion amount can be detected. Therefore, as compared to the case of detecting the optical current itself as generated by emitting a light beam, it is possible to simplify the structure of the circuit for detecting the photoelectric conversion amount.

As described, by adopting the pixel of a simplified structure for the photosensor, it is possible to reduce the size of the photosensor. As a result, a higher resolution can be realized. Moreover, the simplified pixel structure of the photosensor also permits the manufacturing process of the photoelectric converter adopting the photosensor to be simplified.

The foregoing method of detecting photoelectric conversion amount may be further arranged such that before storing the predetermined amount of charge in the auxiliary capacitance in the step (1), the auxiliary capacitance is completely discharged.

According to the foregoing structure, by storing the predetermined amount of charge after completely discharging the auxiliary capacitance, it is possible to control with ease the amount of charge to be stored beforehand. With this structure, after storing the predetermined amount of charge in the auxiliary capacitance, the amount of charge remaining in the auxiliary capacitance after releasing therefrom the charge with an application of a light beam indicates an accurate photoelectric conversion amount, and it is therefore possible to detect the photoelectric conversion amount with an improved precision.

Moreover, as the auxiliary capacitance is discharged before storing the predetermined amount of charge in the auxiliary capacitance, i.e., before detecting the photoelectric conversion amount, the charge for the previous detection data would not remain. Therefore, even when repeating the foregoing detecting operation, it is still possible to appropriately detect a photoelectric conversion amount.

In the foregoing method, the predetermined amount of charge may be stored in the auxiliary capacitance in the following manner.

That is, the step (1) of storing the predetermined amount of charge in the auxiliary capacitance may be carried out by adopting a gate electrode driving voltage for use in driving the gate electrode of the thin film transistor.

According to the foregoing structure, a separate member is not needed for storing a predetermined amount of charge in the auxiliary capacitance, and it is therefore possible to simplify the pixel structure which constitutes the photosensor.

The step (1) of storing the predetermined amount of charge in the auxiliary capacitance may be carried out by applying a voltage to one of the electrodes of the auxiliary capacitance, formed on the opposite side of the one connected to the drain electrode of the thin film transistor.

According to the structure, as a voltage is applied to the electrode connected directly to the auxiliary capacitance, it is possible to adjust with ease the amount of charge to be stored in the auxiliary capacitance. As a result, the amount of charge stored by the electric conversion can be detected with precision, and it is therefore possible to detect the photoelectric conversion amount with an improved precision.

The foregoing method of detecting photoelectric conversion amount may be further arranged such that the step (1)

of storing the predetermined amount of charge in the auxiliary capacitance is carried out by applying a voltage to the source electrode of the thin film transistor.

Alternately, the foregoing method may be arranged such that the charge to be released from the source electrode of the thin film transistor by emitting a light beam is erased in the non-conductive state of the thin film transistor.

According to the foregoing structure, as the charge is not detected by the thin film transistor in the non-conductive state, a detection error of the photoelectric conversion amount can be prevented.

The foregoing method of detecting photoelectric conversion amount may be further arranged such that: during a period of detecting the photoelectric conversion amount of the photoelectric conversion element, an emission of a light beam onto the thin film transistor is stopped.

According to the foregoing structure, while detecting the photoelectric conversion amount as converted by the photoelectric conversion element, an optical current is not generated by emitting a light beam onto the thin film transistor, and thus a detection error of the photoelectric conversion amount can be prevented. Namely, a crosstalk in the source electrode direction of the thin film transistor, i.e., in the data direction can be prevented.

As described, the photoelectric converter of the present invention may be arranged so as to include:

at least one a photoelectric conversion element provided with a thin film transistor having a photosensitive semiconductor layer and an auxiliary capacitance connected to a drain electrode of the thin film transistor; and photoelectric conversion amount detection means for detecting a photoelectric conversion amount, that is an amount of optical current as converted by the photoelectric conversion element, the photoelectric conversion amount detecting means being connected to a source electrode of the thin film transistor, wherein a predetermined amount of charge is stored in the auxiliary capacitance, and the charge stored in the auxiliary capacitance is released from the auxiliary capacitance by emitting a light beam onto the thin film transistor in a non-conductive state; and the photoelectric amount detection means detects the photoelectric conversion amount as converted by the photoelectric conversion element based on an amount of charge remaining in the auxiliary capacitance after an emission of a light beam onto the photosensitive semiconductor layer has been completed.

According to the foregoing structure, by storing the predetermined amount of charge beforehand in the auxiliary capacitance, a photoelectric conversion amount can be detected based on the amount of charge remaining in the auxiliary capacitance after releasing therefrom the charge by emitting a light beam.

As described, by detecting the amount of charge remaining in the auxiliary capacitance, the photoelectric conversion amount can be detected. Therefore, as compared to the case of detecting the optical current itself as generated by emitting a light beam, it is possible to simplify the structure of the circuit for detecting the photoelectric conversion amount.

As described, by adopting the pixel of a simplified structure for the photosensor, it is possible to reduce the size of the photosensor. As a result, a higher resolution can be realized. Moreover, the simplified pixel structure of the photosensor also permits the manufacturing process of the photoelectric converter adopting the photosensor to be simplified.

The photoelectric converter of the foregoing structure may be arranged such that:

the photoelectric conversion amount detection means includes an amplifier circuit for amplifying the charge to be transferred from the auxiliary capacitance.

According to the foregoing structure, even in the case where the amount of charge remaining in the auxiliary capacitance is small, as the change can be amplified by the amplifier circuit, it is still possible to accurately detect the photoelectric conversion amount.

In order to achieve the foregoing object, the image input method for inputting as image data, an optical current generated by a light reflected from a document image as converted by a photoelectric conversion element provided with a thin film transistor including a photosensitive semiconductor layer, is characterized by including the steps of:

(1) storing a predetermined amount of charge in an auxiliary capacitance connected to a drain electrode of the thin film transistor;

(2) emitting a light beam onto the photosensitive semiconductor layer for a predetermined time in a non-conductive state of the thin film transistor after carrying out the step (1) of storing the predetermined amount of charge in the auxiliary capacitance; and (3) detecting a photoelectric conversion amount that is an amount of optical current as converted by the photoelectric conversion element based on an amount of charge remaining in the auxiliary capacitance after carrying out the step (2) of emitting a light beam onto the photosensitive semiconductor layer for the predetermined time, and outputting the result of detection as image data.

According to the foregoing structure wherein a predetermined amount of charge is stored in the auxiliary capacitance, and then the charge is released from the auxiliary capacitance, it is possible to detect the amount of charge as stored (photoelectric conversion amount) by detecting the amount of charge remaining in the auxiliary capacitance.

As described, by detecting the photoelectric conversion amount based on the amount of charge remaining in the auxiliary capacitance, the optical current can be detected accurately, and by preparing the image data based on the resulting photoelectric conversion amount, it is possible to input image data with accuracy.

As described, the image input device of the present invention is characterized in that the photoelectric conversion device of the foregoing structure is provided in plural number, each corresponding to a document image; and image data output means for outputting, as input image data of the document image, the photoelectric conversion amount converted by the photoelectric conversion element as detected by each of the plurality of the photoelectric converters.

By adopting the photoelectric converter of the foregoing structure, an image input device of high resolution can be realized, and it is therefore possible for the image data output means to output fairly fine input image data.

The image input device of the present invention is further including:

light emission means for projecting a red light beam, a green light beam and a blue light beam onto a document image, wherein:

the image data output means outputs image data as input from a photoelectric conversion amount that is an amount of optical current as converted by the photoelectric conversion element as detected according to the respective color light beams as emitted from the light emission means.

According to the foregoing structure, it is possible to obtain a fairly fine color image.

In the foregoing image input device, the photoelectric converter is arranged in 1D or in 2D.

By adopting the photoelectric converter arranged in 1D, the image input device of the present invention can be suitably applied to a portable image input device such as a handy scanner, etc., adopted in a home facsimile machine.

On the other hand, by adopting the photoelectric converter arranged in 2D, the image input device of the present invention can be suitably applied to the flat head scanner, etc. In this case, it is possible to read the entire document image at once.

As described, the two-dimensional image sensor realized by adopting the photoelectric converter of the foregoing structure has the following structures.

That is, the two-dimensional image sensor is arranged so as to include:

a plurality of data lines;

a plurality of scanning lines which interest the data lines;

a photoelectric conversion element including i) a plurality of thin film transistors, each including a photosensitive semiconductor layer, provided at respective intersections between the plurality of data lines and the plurality of scanning lines, and ii) auxiliary capacitances for storing the charge, the auxiliary capacitances being connected to respective drain electrodes of the plurality of thin film transistors;

photoelectric conversion amount detection means for detecting a photoelectric conversion amount that is an amount of optical current as converted by each of the plurality of photoelectric conversion elements, the photoelectric conversion amount detection means being connected to respective source electrodes of the thin film transistors; and image data output means for outputting as image data, a result of detection by each of the photoelectric conversion amount detection means, wherein a predetermined amount of charge is stored in each of the plurality of auxiliary capacitances, and the charge is released from the auxiliary capacitance by emitting a light beam in a non-conductive state of corresponding thin film transistor; and the photoelectric amount detection means detects a photoelectric conversion amount that is an amount of an optical current as converted by the photoelectric conversion element based on an amount of charge remaining in the auxiliary capacitance after an emission of a light beam onto the photosensitive semiconductor means has been completed.

According to the foregoing structure, it is possible to read the two-dimensional image with a simple structure.

The foregoing two-dimensional image sensor may be arranged such that the plurality of data lines, the plurality of scanning lines, the thin film transistors and the plurality of auxiliary capacitances are formed on a transparent substrate.

The foregoing two-dimensional image sensor may be arranged such that a transparent protective film is formed on a surface of the transparent substrate on a side where the plurality of thin film transistors are formed.

The foregoing two-dimensional image sensor may be arranged such that the light emission means is provided on a surface of the transparent substrate on a side opposite to the side where the plurality of thin film transistors are formed; and a light beam is emitted onto an object on the surface having formed thereon the plurality of thin film transistors, and a light reflected from the object is incident on the plurality of thin film transistors.

The foregoing two-dimensional image sensor may be arranged so as to further include:

light emission control means for controlling an emission of a light beam from the light emission means, wherein after the predetermined amount of charge has been stored in the auxiliary capacitance, the light emission control means controls the light emission means to emit a light beam for a predetermined time; and the photoelectric conversion amount detection means detects a photoelectric conversion amount that is an amount of optical current as converted by the photoelectric conversion element based on an amount of charge remaining in the auxiliary capacitance in a period in which an emission of a light beam is stopped after the light beam has been emitted by the light emission means for a predetermined time.

The method of driving the foregoing two-dimensional image sensor may be arranged so as to include the steps of:

(1) storing a predetermined amount of charge in each of the plurality of auxiliary capacitances connected to respective thin film transistors; and (2) detecting after carrying out the step (1), a photoelectric conversion amount that is an amount of optical current as converted by each of the plurality of photoelectric conversion elements based on an amount of charge remaining in the auxiliary capacitance by conducting the plurality of thin film transistors in order by driving the plurality of scanning lines.

The method of driving the foregoing two-dimensional image sensor is arranged so as to include the steps of:

(1) storing a predetermined amount of charge in each of the plurality of auxiliary capacitances connected to respective thin film transistors;

(2) emitting after carrying out the step (1), a light beam by the light emission means for a predetermined time; and (3) detecting the photoelectric conversion amount as converted by the photoelectric conversion element based on an amount of charge remaining in the auxiliary capacitance by conducting the plurality of thin film transistors in order by driving the plurality of scanning lines, by stopping an emission of a light beam by driving the scanning lines after the step (2).

In any of the foregoing driving methods of the present invention, it is possible to accurately detect the photoelectric conversion amount.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

As described, according to the photoelectric converter of the present invention, it is possible to realize a high density pixel by reducing the size of the photosensor section, and also possible to realize a photosensor of a simple structure. Moreover, the photoelectric converter of a large dynamic range can be obtained. The photoelectric converter of the present invention is also characterized by utilizing the gate driving signal of the TFT as the method of storing the predetermined amount of charge in the auxiliary capacitance. As a result, it is possible to realize a photosensor that can be driven at simple timing without requiring the photosensor of a complicated structure. The photoelectric converter of the present invention is applicable to not only the 2D image sensor but also the 1D image sensor.

The invention claimed is:

1. A method of detecting a photoelectric conversion amount, for detecting a photoelectric conversion amount of a photoelectric converter which comprises a thin film transistor including a photosensitive semiconductor layer, said method comprising the steps of:
   (1) storing a predetermined amount of charge in an auxiliary capacitance connected to a drain electrode of said thin film transistor;
   (2) emitting a light beam onto said photosensitive semiconductor layer for a predetermined time in a non-conductive state of said thin film transistor after the predetermined amount of charge has been stored in said auxiliary capacitance in said step (1); and
   (3) detecting the photoelectric conversion amount that is an amount of an optical current as converted by said photoelectric converter, based on an amount of charge remaining in said auxiliary capacitance after emitting a light beam onto said photosensitive semiconductor layer in said step (2).

2. The method of detecting photoelectric conversion amount as set forth in claim 1, characterized by further comprising the step of:
   completely discharging said auxiliary capacitance before carrying out said step (1) of storing the predetermined amount of charge in said auxiliary capacitance.

3. The method of detecting photoelectric conversion amount as set forth in claim 1, characterized in that:
   said step (1) of storing the predetermined amount of change in said auxiliary capacitance is carried out by adopting a gate electrode driving voltage for use in driving a gate electrode of said thin film transistor.

4. The method of detecting photoelectric conversion amount as set forth in claim 1, characterized in that:
   said step (1) of storing the predetermined amount of charge in said auxiliary capacitance is carried out by applying a voltage to one of electrodes of said auxiliary capacitance, formed on an opposite side of the one connected to a drain electrode of said thin film transistor.

5. The method of detecting photoelectric conversion amount as set forth in claim 1, characterized in that:
   said step (1) of storing the predetermined amount of charge in said auxiliary capacitance is carried out by applying a voltage to a source electrode of said thin film transistor.

6. The method of detecting photoelectric conversion amount as set forth in claim 1, characterized in that:
   the charge to be released from the source electrode of said thin film transistor by emitting a light beam is erased in a non-conductive state of said thin film transistor.

7. The method of detecting photoelectric conversion amount as set forth in claim 1, characterized in that:
   during a period of detecting the photoelectric conversion amount of said photoelectric conversion element, an emission of a light beam onto said thin film transistor is stopped.

8. A photoelectric converter, comprising:
   at least one a photoelectric conversion element provided with a thin film transistor having a photosensitive semiconductor layer and an auxiliary capacitance connected to a drain electrode of the thin film transistor; and
   photoelectric conversion amount detection means for detecting a photoelectric conversion amount, that is an amount of optical current as converted by said photoelectric conversion element, said photoelectric conversion amount detecting means being connected to a source electrode of said thin film transistor,
   wherein a predetermined amount of charge is stored in said auxiliary capacitance, and the charge stored in said auxiliary capacitance is released from said auxiliary capacitance by emitting a light beam onto said thin film transistor in a non-conductive state; and
   said photoelectric amount detection means detects the photoelectric conversion amount as converted by said photoelectric conversion element based on an amount of charge remaining in said auxiliary capacitance after an emission of a light beam onto said photosensitive semiconductor layer has been completed.

9. The photoelectric converter as set forth in claim 8, wherein:
   said photoelectric conversion amount detection means includes an amplifier circuit for amplifying the charge to be transferred from said auxiliary capacitance.

10. An image input method for inputting as image data, an optical current generated by a light reflected from a document image as converted by a photoelectric conversion element provided with a thin film transistor including a photosensitive semiconductor layer, comprising the steps of:
    (1) storing a predetermined amount of charge in an auxiliary capacitance connected to a drain electrode of said thin film transistor;
    (2) emitting a light beam onto said photosensitive semiconductor layer for a predetermined time in a non-conductive state of said thin film transistor after carrying out said step (1) of storing the predetermined amount of charge in said auxiliary capacitance; and
    (3) detecting a photoelectric conversion amount that is an amount of optical current as converted by said photoelectric conversion element based on an amount of charge remaining in said auxiliary capacitance after carrying out said step (2) of emitting a light beam onto said photosensitive semiconductor layer for the predetermined time, and outputting the result of detection as image data.

11. An image input device, comprising:
    said photoelectric converter of claim 8 provided in plural number, each corresponding to a document image; and
    image data output means for outputting, as input image data of the document image, the photoelectric conversion amount converted by said photoelectric conversion element as detected by each of said plurality of said photoelectric converters.

12. The image input device as set forth in claim 11, comprising:
    light emission means for projecting a red light beam, a green light beam and a blue light beam respectively onto a document image, wherein:
    said image data output means outputs as a color image, the image data as input based on the photoelectric conversion amount converted by said photoelectric conversion element as detected according to light beams in respective colors emitted from said light emission means.

13. The image input device as set forth in claim 11, wherein said plurality of photoelectric converters are arranged in 1D.

14. The image input device as set forth in claim 11, wherein said photoelectric converters are arranged in 2D.

15. A two-dimensional image sensor, comprising:
a plurality of data lines;
a plurality of scanning lines which interest said data lines;
a photoelectric conversion element including i) a plurality of thin film transistors, each including a photosensitive semiconductor layer, provided at respective intersections between said plurality of data lines and said plurality of scanning lines, and ii) auxiliary capacitances for storing the charge, said auxiliary capacitances being connected to respective drain electrodes of said plurality of thin film transistors;
photoelectric conversion amount detection means for detecting a photoelectric conversion amount that is an amount of optical current as converted by each of said plurality of photoelectric conversion elements, said photoelectric conversion amount detection means being connected to respective source electrodes of said thin film transistors; and
image data output means for outputting as image data, a result of detection by each of said photoelectric conversion amount detection means,
wherein a predetermined amount of charge is stored in each of said plurality of auxiliary capacitances, and the charge is released from said auxiliary capacitance by emitting a light beam in a non-conductive state of corresponding thin film transistor; and
said photoelectric amount detection means detects a photoelectric conversion amount that is an amount of an optical current as converted by said photoelectric conversion element based on an amount of charge remaining in said auxiliary capacitance after an emission of a light beam onto said photosensitive semiconductor means has been completed.

16. The two-dimensional image sensor as set forth in claim 15, wherein:
said plurality of data lines, said plurality of scanning lines, said thin film transistors and said auxiliary capacitances are formed on a transparent substrate.

17. The two-dimensional image sensor as set forth in claim 16, wherein:
a transparent protective film is formed on a surface of said transparent substrate on a side where said plurality of thin film transistors are formed.

18. The two-dimensional image sensor as set forth in claim 16, wherein:
said light emission means is provided on a surface of said transparent substrate on a side opposite to the side where said plurality of thin film transistors are formed; and
a light beam is emitted onto an object on the surface having formed thereon said plurality of thin film transistors, and a light reflected from the object is incident on said plurality of thin film transistors.

19. The two-dimensional image sensor as set forth in claim 15, further comprising:
light emission control means for controlling an emission of a light beam from said light emission means,
wherein after the predetermined amount of charge has been stored in said auxiliary capacitance, said light emission control means controls said light emission means to emit a light beam for a predetermined time; and
said photoelectric conversion amount detection means detects a photoelectric conversion amount that is an amount of optical current as converted by said photoelectric conversion element based on an amount of charge remaining in said auxiliary capacitance in a period in which an emission of a light beam is stopped after the light beam has been emitted by said light emission means for a predetermined time.

20. A method of driving said two-dimensional image sensor of claim 15, comprising the steps of:
(1) storing a predetermined amount of charge in each of said plurality of auxiliary capacitances connected to respective thin film transistors; and
(2) detecting after carrying out said step (1), a photoelectric conversion amount that is an amount of optical current as converted by each of said plurality of photoelectric conversion elements based on an amount of charge remaining in said auxiliary capacitance by conducting said plurality of thin film transistors in order by driving said plurality of scanning lines.

21. A method of driving said two-dimensional image sensor of claim 19, comprising the steps of:
(1) storing a predetermined amount of charge in each of said plurality of auxiliary capacitances connected to respective thin film transistors;
(2) emitting after carrying out said step (1), a light beam by said light emission means for a predetermined time; and
(3) detecting the photoelectric conversion amount as converted by said photoelectric conversion element based on an amount of charge remaining in said auxiliary capacitance by conducting said plurality of thin film transistors in order by driving said plurality of scanning lines, by stopping an emission of a light beam by driving the scanning lines after said step (2).

* * * * *